United States Patent
Kwon et al.

(10) Patent No.: US 8,032,695 B2
(45) Date of Patent: Oct. 4, 2011

(54) MULTI-PATH ACCESSIBLE SEMICONDUCTOR MEMORY DEVICE WITH PREVENTION OF PRE-CHARGE SKIP

(75) Inventors: Jin-Hyoung Kwon, Seongnam-si (KR); Han-Gu Sohn, Suwon-si (KR); Dong-Woo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 758 days.

(21) Appl. No.: 12/151,946

(22) Filed: May 9, 2008

(65) Prior Publication Data
US 2008/0282042 A1 Nov. 13, 2008

(30) Foreign Application Priority Data
May 11, 2007 (KR) .................. 10-2007-0045864

(51) Int. Cl.
*G06F 12/16* (2006.01)
*G06F 12/00* (2006.01)

(52) U.S. Cl. ........ 711/105; 711/104; 711/149; 711/150; 711/151; 711/152; 711/153

(58) Field of Classification Search .................. None
See application file for complete search history.

(56) References Cited

U.S. PATENT DOCUMENTS

| | | | | |
|---|---|---|---|---|
| 6,002,632 A * | 12/1999 | Krueger | ............. | 365/230.03 |
| 6,195,724 B1 * | 2/2001 | Stracovsky et al. | ............. | 710/244 |
| 6,532,505 B1 * | 3/2003 | Stracovsky et al. | ............. | 710/63 |
| 6,799,241 B2 * | 9/2004 | Kahn et al. | ............. | 711/105 |
| 7,404,047 B2 * | 7/2008 | Dodd et al. | ............. | 711/147 |
| 2001/0013082 A1 * | 8/2001 | Jeddeloh | ............. | 711/105 |
| 2002/0065981 A1 * | 5/2002 | Jenne et al. | ............. | 711/105 |
| 2003/0126354 A1 * | 7/2003 | Kahn et al. | ............. | 711/105 |
| 2004/0103243 A1 * | 5/2004 | Dorst | ............. | 711/105 |
| 2004/0193787 A1 * | 9/2004 | Takizawa | ............. | 711/105 |
| 2005/0204093 A1 * | 9/2005 | Rotithor et al. | ............. | 711/105 |
| 2006/0095646 A1 * | 5/2006 | Gower et al. | ............. | 711/100 |
| 2007/0005902 A1 * | 1/2007 | Petersen et al. | ............. | 711/137 |
| 2007/0047362 A1 * | 3/2007 | Kuwabara | ............. | 365/222 |
| 2007/0070794 A1 | 3/2007 | Lee et al. | | |
| 2007/0294470 A1 * | 12/2007 | Van Dyke et al. | ............. | 711/104 |
| 2008/0282029 A1 * | 11/2008 | Balakrishnan et al. | ....... | 711/105 |

OTHER PUBLICATIONS

Korean Patent Publication No. 2006-0100143 having Publication date of Sep. 20, 2006 (w/ English Abstract page).
Japanese Patent Application No. H5-250315 having Publication date of Sep. 28, 1993 (w/ English Abstract page).
Japanese Patent Application No. 2005-259320 having Publication date of Sep. 22, 2005 (w/ English Abstract page).

* cited by examiner

*Primary Examiner* — Matt Kim
*Assistant Examiner* — Ralph A Verderamo, III
(74) *Attorney, Agent, or Firm* — Monica H. Choi

(57) ABSTRACT

A multiprocessor system includes first and second processors and a multi-path accessible semiconductor memory device including a shared memory area and a pseudo operation execution unit. The shared memory area is accessible by the first and second processors according to a page open policy. The pseudo operation execution unit responds to a virtual active command from one of the first and second processors to close a last-opened page. The virtual active command is generated with a row address not corresponding to any row of the shared memory area. For example, bit-lines of a last accessed row are pre-charged for closing the last-opened page.

20 Claims, 18 Drawing Sheets

MULTI-PATH ACCESSIBLE SEMICONDUCTOR MEMORY DEVICE WITH PREVENTION OF PRE-CHARGE SKIP

This application claims priority under 35 USC §119 to Korean Patent Application No. 2007-45864, filed on May 11, 2007 in the Korean Intellectual Property Office, the disclosure of which is incorporated herein in its entirety by reference.

BACKGROUND OF THE INVENTION

1. Field of the Invention

The present invention relates generally to semiconductor memory devices, and more particularly, to a multi-path accessible semiconductor memory device that responds to a virtual row active command to prevent a pre-charge skip for an opened page upon transfer of access authority.

2. Background of the Invention

Generally, a semiconductor memory device having a plurality of access ports is called a multi-port memory device. In particular, a memory device having two access ports is called a dual-port memory device. The dual-port memory device is known in the prior art as an image processing video memory device having a RAM (random access memory) port accessible in a random sequence and a SAM (sequential access memory) port accessible only in a serial sequence.

In addition, a dynamic random access memory (DRAM) device having a shared memory area accessible by multiple processors is herein called a multi-path accessible semiconductor memory device. For example in recent mobile communication systems, electronic devices such as handheld multimedia players, handheld phones, or personal digital assistants (PDAs) each include a multiprocessor system with multiple processors as shown in FIG. 1 for effectively operating with high speed.

FIG. 1 shows a block diagram of a multiprocessor system in a mobile communication device according to the conventional art. The multiprocessor system of FIG. 1 includes a first processor 101 and a second processor 201 connected to each other through a connection line B3. The multiprocessor system of FIG. 1 also includes a first flash memory device 301 and a first DRAM (dynamic random access memory) device 401 coupled to the first processor 101 via a first system bus B1.

The multiprocessor system of FIG. 1 further includes a second DRAM device 402 and a second flash memory device 302 coupled to the second processor 201 via a second system bus B2. The first processor 101 may include applications for data communication or for games, and the second processor 201 may include applications for MODEM functions such as modulation/demodulation of a communication signal.

The flash memory devices 301 and 302 may each be an NOR flash memory device having a NOR structure or a NAND flash memory device having a NAND structure. The NOR or NAND flash memory device is a nonvolatile memory device comprised of an array of memory cells each having a floating gate. The nonvolatile memory device stores data that is not changed even when power is removed. The DRAM devices 401 and 402 are used as main memories for data processing by the corresponding processors 101 and 201.

However in the multi processor system of FIG. 1, each of the processors 101 and 201 is connected to respective DRAM devices 401 and 402. In addition, UART, SPI, or SRAM interfaces operating with relatively low speed are used therein resulting in low data transmission speed. Accordingly, a multiprocessor system of FIG. 2 with just one DRAM device 403 is implemented for increased data transmission speed and reduced sized.

The multiprocessor system of FIG. 2 includes the first processor 101 and the second processor 201 connected to a first flash memory device 303 and a second flash memory device 304, respectively, via system buses B4 and B5, respectively. The multiprocessor system of FIG. 2 also includes the one DRAM device 403 connected to both the first and second processors 101 and 201 via system buses B1 and B2, respectively.

Accordingly in FIG. 2, the one DRAM 403 is accessed by each of the first and second processors 101 and 201 through two different paths, as also disclosed in U.S. Patent Application No. US2003/0093628 to Matter et. al. In such prior art, the one DRAM device 403 includes a memory cell array with first, second, and third portions. The first portion of the memory cell array is accessed only by the first processor 101. The second portion of the memory cell array is accessed only by the second processor 201. The third portion of the memory cell array is a shared memory area accessed by both of the first and second processors 101 and 201.

Mediation is needed for access to the shared memory area by the first and second processors 101 and 201. A UART, SPI or SRAM interface has been used for communication between conventional processors via the system bus B3. However, such an interface operates with limited speed and increased number of pins for three-dimensional games or image communications. Thus, an interface with higher operating speed is desired. Further in FIG. 2, having respective flash memory devices 303 and 304 for each of the processors 101 and 201 may result in complication or increased cost.

Accordingly, a multiprocessor system of FIG. 3 includes first and second processors 100 and 200 that share one DRAM 400 and one flash memory device 300. A data interface between the processors 100 and 200 is implemented through the multi-path accessible DRAM 400. Also in FIG. 3, the first processor 100 is not directly connected to the flash memory device 300 but indirectly accesses the flash memory device 300 through the multi-path accessible DRAM 400.

Each of the processors in FIGS. 2 and 3 may support a page open policy to read or write data from or to the one DRAM device 400. The page open policy has higher data access speed than a page closed policy. For example, when reading data from memory cells connected to a same word line according to the page open policy, the word line is activated only one time, and the bit lines of such memory cells are sensed thereafter.

In contrast for reading such data according to the page closed policy, the word line is re-activated every-time a bit-line is sensed. Thus, additional time for pre-charging the bit lines and re-activating the word line is needed in the page closed policy. Accordingly, recent processors use the page open policy for increased speed for accessing a memory device.

FIG. 4 illustrates a pre-charge skip that occurs upon transfer of access authority according to a page open policy supported by the processors of FIG. 2 or 3. Referring to FIG. 4, a waveform PC indicates commands generated in a page closed policy, and a waveform PO indicates commands generated in a page open policy.

Referring to waveform PC, for reading/writing data from a memory cell connected to an intersection of word line W/L1 and bit line B/L1, a row active command ACT is generated to activate word line W/L1 during a time interval I1. Subsequently, a read/write command R/W is generated to sense or activate bit line B/L1 during time interval I2.

Then for reading/writing data from a memory cell connected to an intersection of the word line W/L1 and bit line B/L2 different from the bit line B/L1, a command PRE to pre-charge the bit line B/L1 is first generated. Thereafter, a row active command ACT to activate the word line W/L1 is then generated. Such pre-charge and row active commands PRE and ACT are applied on the one DRAM 400 or 403 during a time interval A. Subsequently, a read/write command R/W to sense or activate bit line B/L2 is applied on the one DRAM 400 or 403 during a time interval I3.

In contrast referring to the waveform PO in FIG. 4, for reading/writing data from a memory cell connected to an intersection of word line W/L1 and bit line B/L1, a row active command ACT is applied on the one DRAM 400 or 403 to activate word line W/L1 during a time interval T1. Subsequently, a read/write command R/W is applied on the one DRAM 400 or 403 to sense or activate bit line B/L1 during a time interval T2.

For the read mode for example, data is read from the memory cell connected to the intersection of the bit line B/L1 and the word line W/L1 of the one DRAM 400 or 403. Subsequently, in reading/writing data from/to a memory cell connected to an intersection of the word line W/L1 and a bit line B/L2 different from the bit line B/L1, another read/write command R/W is immediately applied to the one DRAM 400 or 403 to sense or activate bit line B/L2. Thus, the pre-charge and row active commands PRE and ACT shown during the time interval A of the waveform PC are omitted in the waveform PO.

Accordingly for the page open policy, the bit lines of memory cells connected to the same word line are sensed or activated with the same word line being maintained to be activated without the time interval A for the page closed policy. Thus, data is accessed with higher speed in the page open policy than in the page closed policy.

When a page is changed in the page open policy, a page close operation should be executed for the opened page when another word line is selected to be activated. However, when authority to access the multi-path accessible DRAM 400 or 403 of FIG. 2 or 3 is transferred from one processor to the other processor (such as at time point to in FIG. 4), a pre-charge operation for bit lines of the shared memory area within the multi-path accessible DRAM 400 or 403 may be skipped with the page open policy.

With such a pre-charge skip, data error may result during a read/write operation performed after the authority transfer. For example, when access authority to the shared memory area of the multi-path accessible DRAM 400 or 403 is transferred from the first processor 100 to the second processor 200 at a time point $t_0$ in FIG. 4, pre-charge of the bit lines B/L1 and B/L2 is skipped.

Subsequently, when the second processor 200 activates another word line and bit line through port B, data error results for the read/write operation. Furthermore, when a bit line is not pre-charged or two word lines are activated simultaneously in a general DRAM, data error results in a read/write operation. Thus, when access authority is to be transferred in a page opened state, the opened page is desired to be closed before the transfer of access authority for preventing data error.

SUMMARY OF THE INVENTION

Accordingly a multiprocessor system according to an aspect of the present invention includes first and second processors and a multi-path accessible semiconductor memory device including a shared memory area and a pseudo operation execution unit. The shared memory area is accessible by the first and second processors according to a page open policy. The pseudo operation execution unit responds to a virtual active command from one of the first and second processors to close a last-opened page. The virtual active command is generated with a row address not corresponding to any row of the shared memory area. For example, bit-lines of a last accessed row are pre-charged for closing the last-opened page.

In an example embodiment of the present invention, the virtual active command is a dummy row active command indicating a dummy row to be activated with the dummy row not being part of the shared memory area. In that case, the dummy row is part of a memory cell array including the shared memory area.

In another example embodiment of the present invention, the multi-path accessible semiconductor memory device further includes a register formed outside of the shared memory area. For example, the register is a semaphore register used for interfacing between the first and second processors, and the register is formed outside of a memory cell array including the shared memory area. In that case, the virtual active command is a register row active command for activating the register for access by one of the first and second processors.

In an example embodiment of the present invention, the shared memory area is comprised of DRAM (dynamic random access memory) cells, and the register is comprised of flip-flops.

In a further example embodiment of the present invention, one of the first and second processors generates the virtual active command to close the last-opened page before access authority is transferred to the other of the first and second processors.

In another example embodiment of the present invention, the multi-path accessible semiconductor memory device further includes a first dedicated memory area accessible only by the first processor and includes a second dedicated memory area accessible only by the second processor.

In this manner, the last-opened page is closed by one of the first and second processors before access authority to the shared memory area is transferred to the other of the first and second processors. Thus, a pre-charge skip is prevented in the multiprocessor system supporting the page open policy.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, and 19 refer to elements having similar structure and/or function.

DETAILED DESCRIPTION OF THE INVENTION

Embodiments of the present invention are now described more fully hereinafter with reference to the accompanying drawings. However, this invention may be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 16:
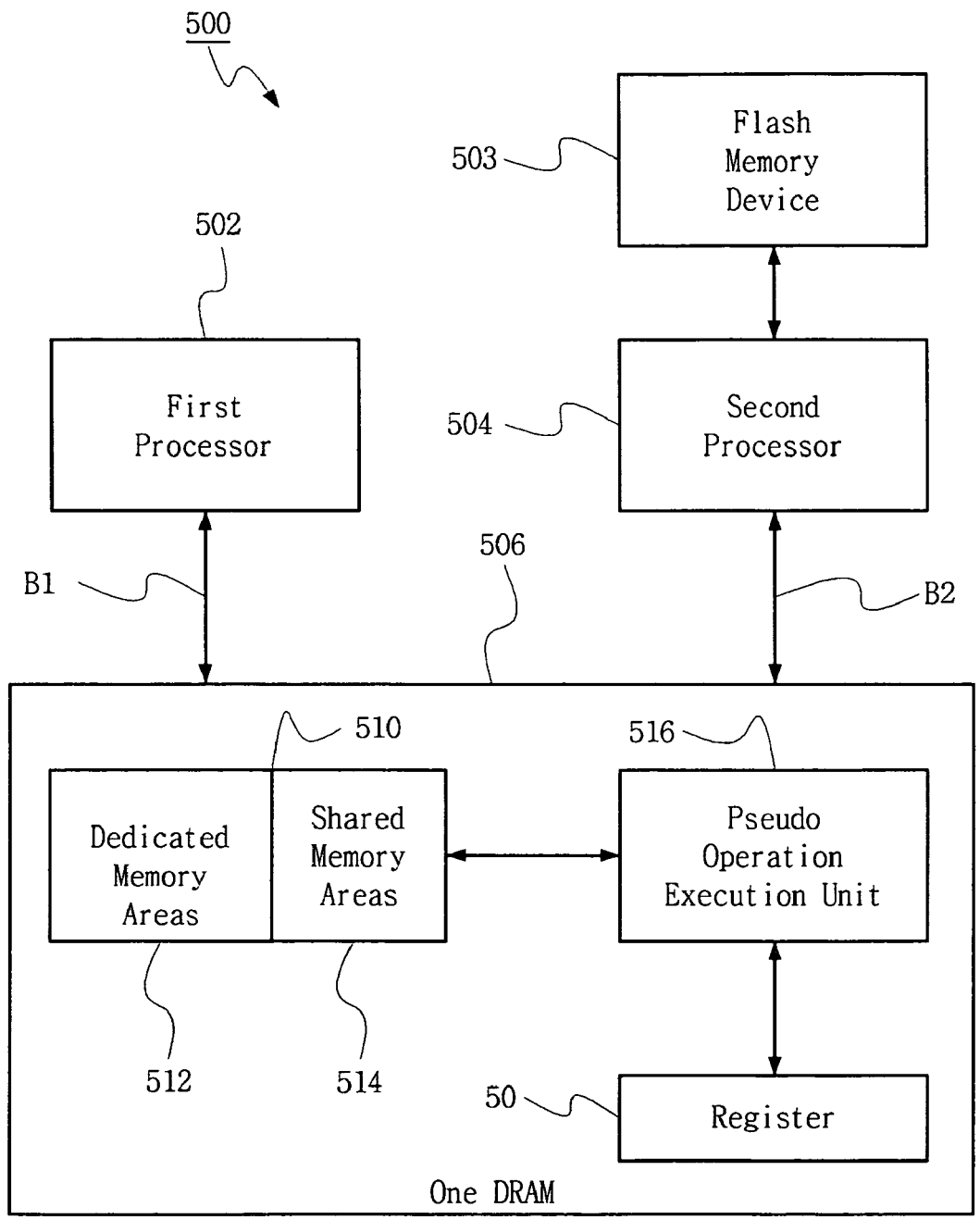
FIG. 16 shows a block diagram of the multiprocessor system with components for preventing a pre-charge skip upon transfer of access authority to a shared memory area, according to an embodiment of the present invention.

FIG. 16 shows a block diagram of a multiprocessor system 500 with components for preventing a pre-charge skip upon transfer of access authority to a shared memory area, according to an embodiment of the present invention. The multiprocessor system 500 includes a first processor 502, a second processor 504, a flash memory device 503 coupled to the second processor 504, and a shared one DRAM (dynamic random access memory) device 506 as an example multi-path accessible semiconductor memory device.

The first processor 502 is connected to the shared one DRAM device 506 via a first system bus B1, and the second processor 504 is connected to the shared one DRAM device 506 via a second system bus B2. The shared one DRAM device 506 includes a memory cell array 510 with dedicated memory areas 512 each accessible by a respective one of the first and second processors 502 and 504. The memory cell array 510 of the shared one DRAM device 506 also includes a shared memory area 514 accessible by both of the first and second processors 502 and 504, but accessible one processor at a time.

The shared one DRAM device 506 further includes an internal register 50 used for interfacing between the first and second processors 502 and 504. The internal register 50 is not part of the memory cell array 510 and thus is not part of the shared memory area 514. The shared one DRAM device 506 additionally includes a pseudo operation execution unit 516 for preventing a pre-charge skip upon transfer of access authority to the shared memory area 514 between the first and second processors 502 and 504.

Figure 17:
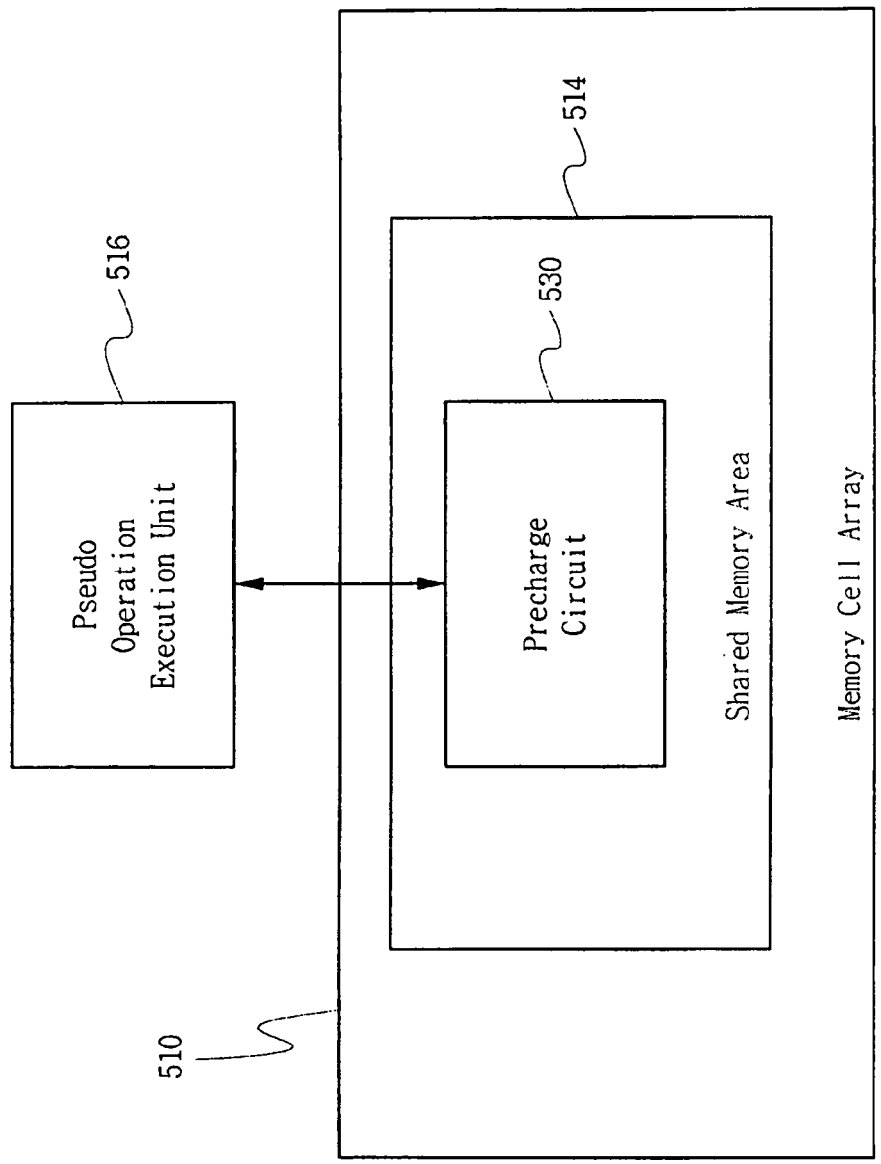
FIG. 17 shows a further block diagram of components of a one DRAM device in the multiprocessor system of FIG. 16 for preventing a pre-charge skip upon transfer of access authority to a shared memory area, according to an embodiment of the present invention.

FIG. 17 shows a block diagram of further components in the shared one DRAM device 506 for preventing a pre-charge skip upon transfer of access authority to the shared memory area 514 between the first and second processors 502 and 504. The pseudo operation execution unit 516 controls a pre-charge circuit 530 of the shared memory area 514 to prevent a pre-charge skip upon transfer of access authority to the shared memory area 514.

Figure 18:
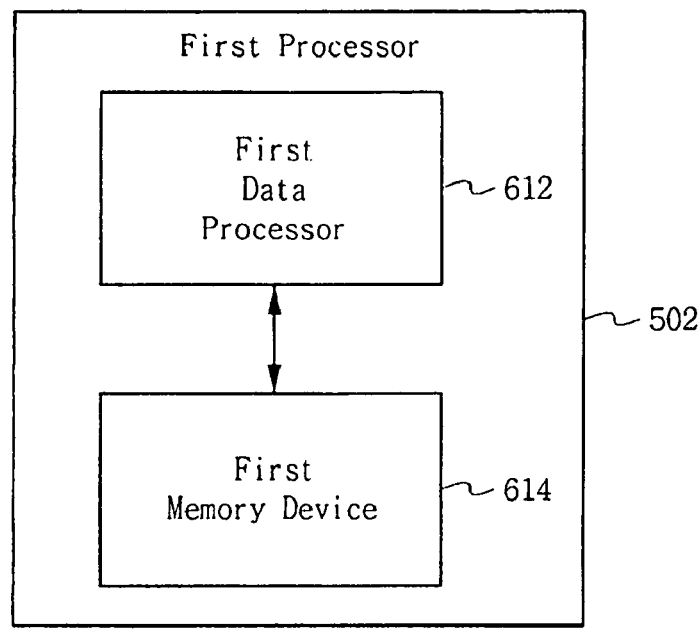
FIGS. 18 and 19 show block diagrams of the multiple processors in FIG. 16, according to an example embodiment of the present invention.
Figure 19:
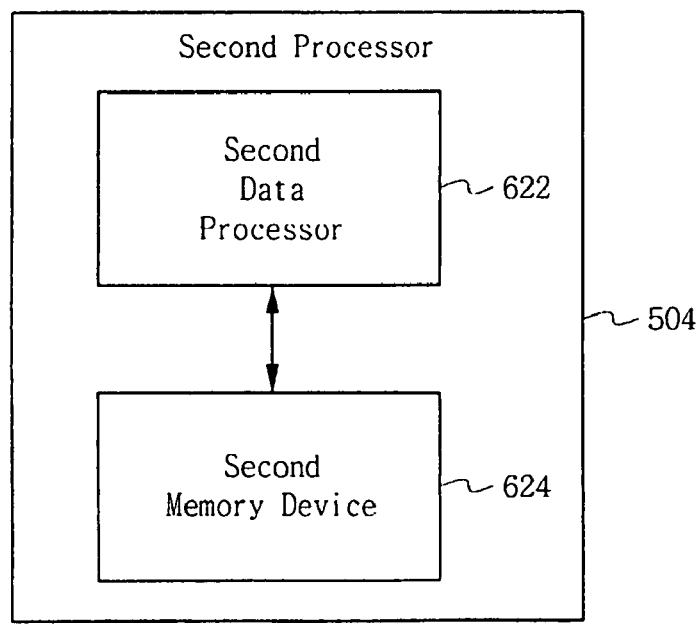

FIG. 18 shows a block diagram of the first processor 502 that includes a first data processor 612 and a first memory device 614 according to an example embodiment of the present invention. The first memory device 614 has sequences of instructions (i.e., software) stored thereon, and execution of such sequences of instructions by the first data processor 612 causes the first data processor 612 to perform any functions or operations described herein for the first processor 502.

Similarly, FIG. 18 shows a block diagram of the second processor 504 that includes a second data processor 622 and a second memory device 624 according to an example embodiment of the present invention. The second memory device 624 has sequences of instructions (i.e., software) stored thereon, and execution of such sequences of instructions by the second data processor 622 causes the second data processor 622 to perform any functions or operations described herein for the second processor 504.

Figure 1:
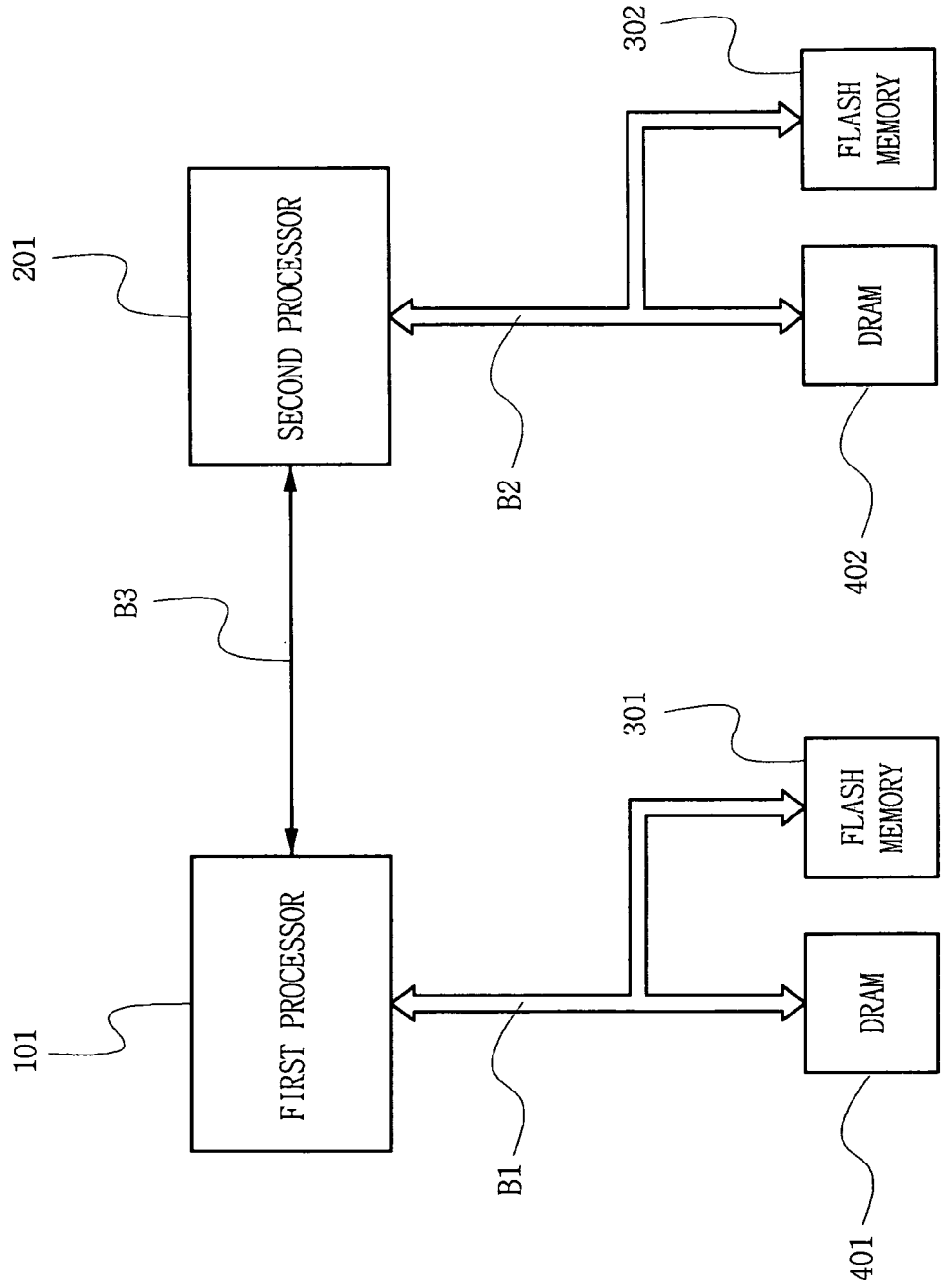
FIG. 1 is a block diagram of a multiprocessor system for use in a mobile communication device according to the conventional art.
Figure 2:
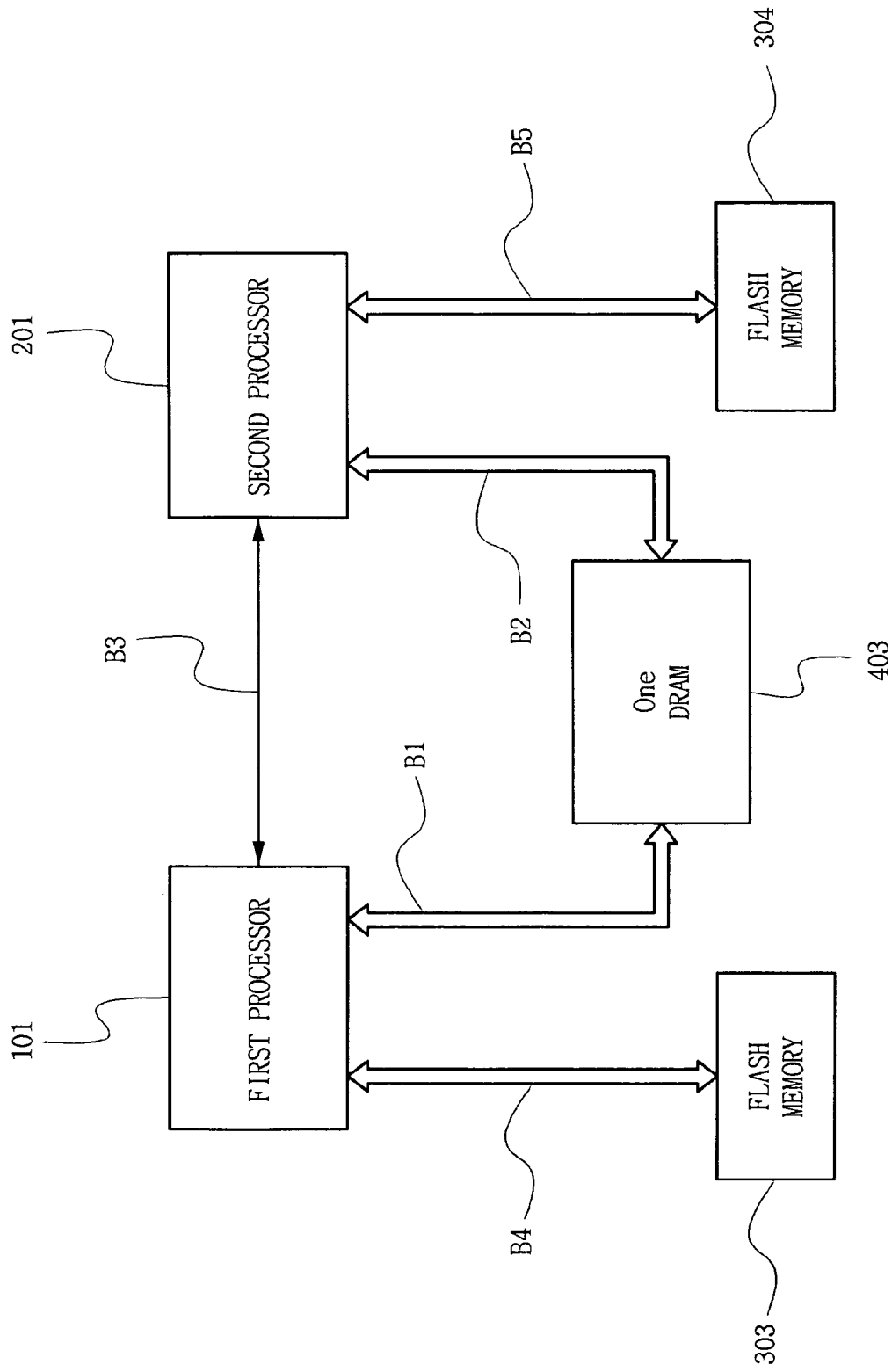
FIG. 2 is a block diagram of a multiprocessor system with a shared DRAM device according to the conventional art.
Figure 3:
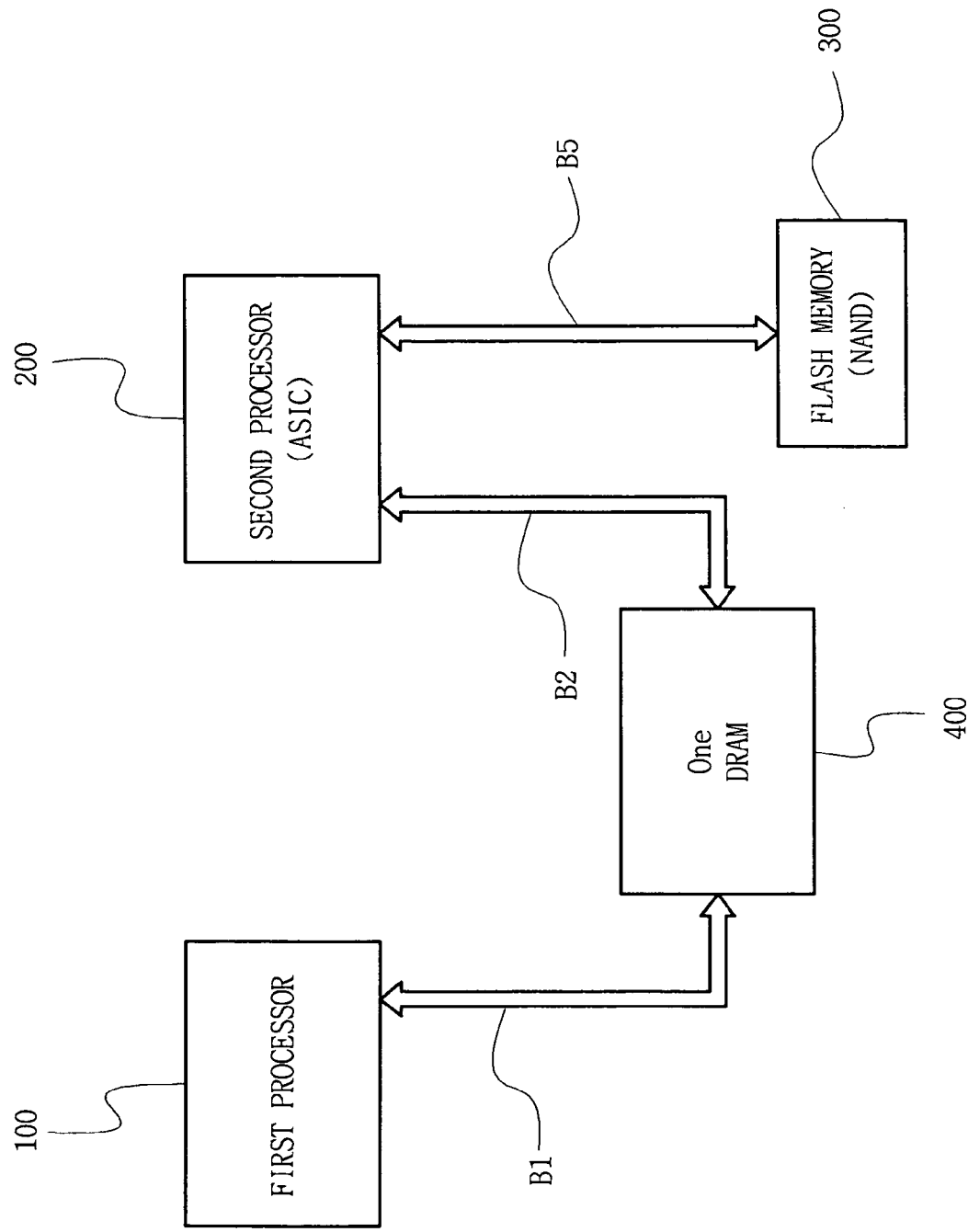
FIG. 3 is a block diagram of a multiprocessor system with a shared DRAM device and a shared flash memory device according to the conventional art.
Figure 4:
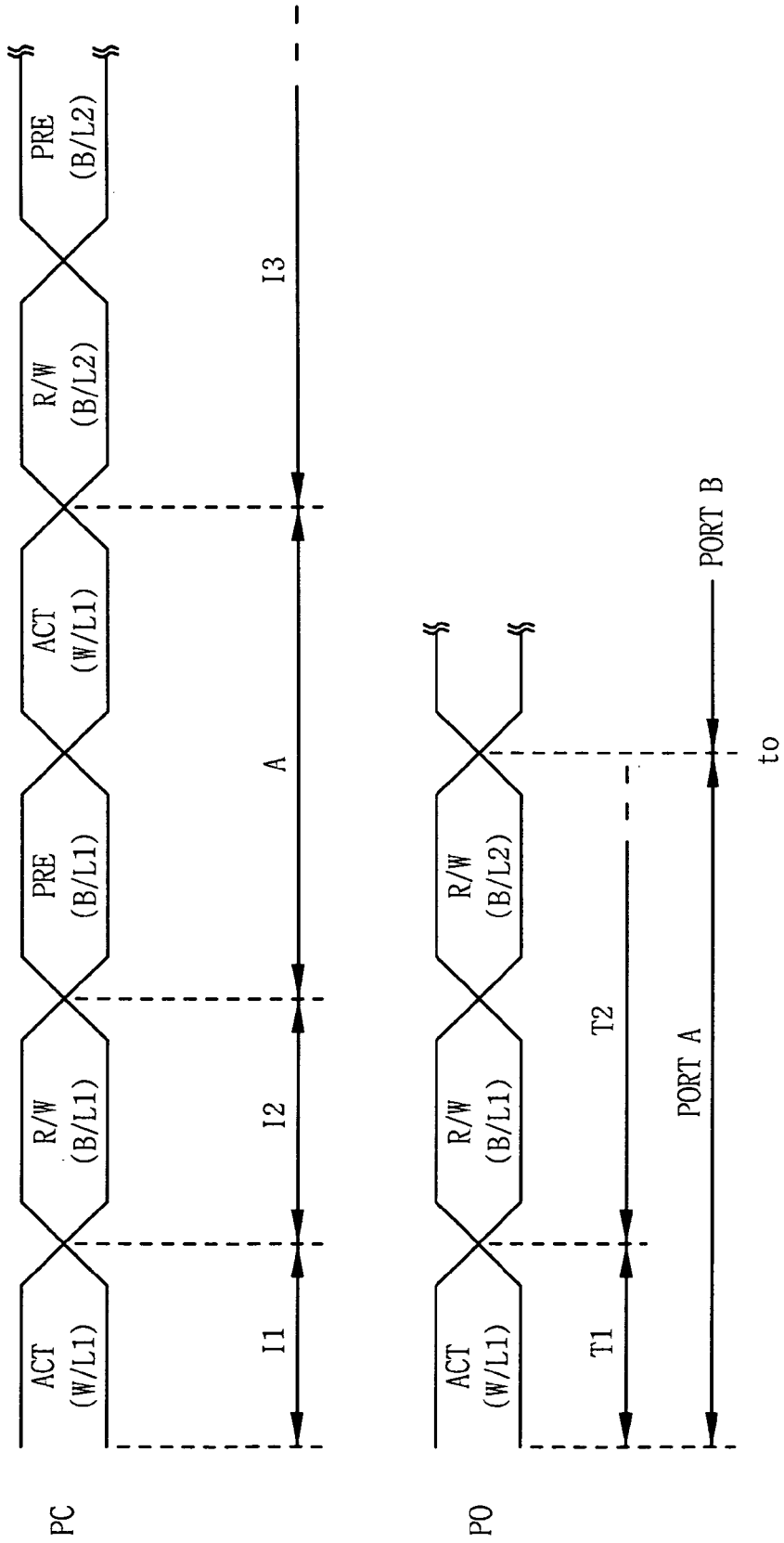
FIG. 4 illustrates a pre-charge skip that occurs upon transfer of access authority according to a page open policy in the multiprocessor system of FIG. 2 or 3, according to the conventional art.
Figure 5:
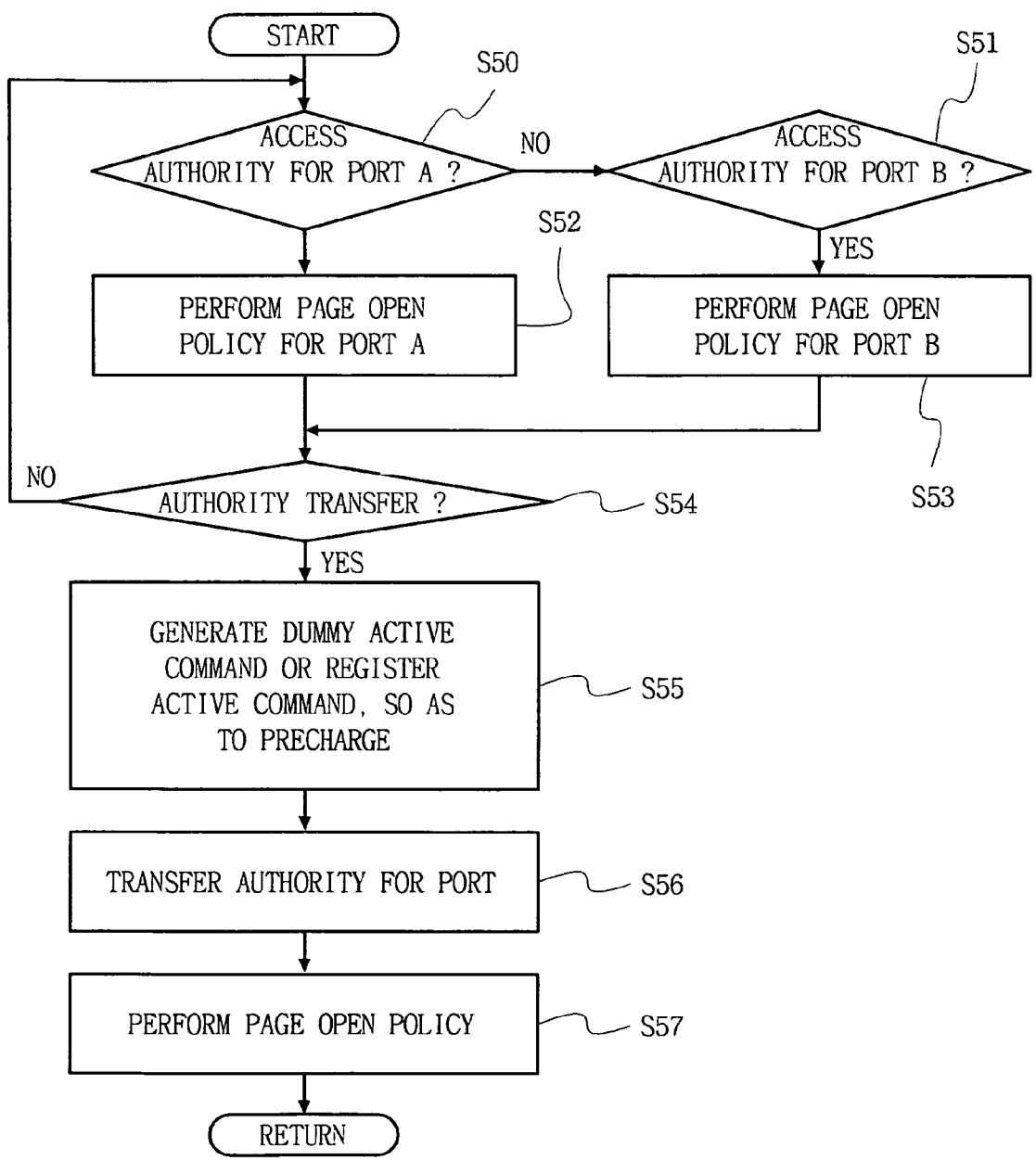
FIG. 5 is a flowchart of steps for preventing a pre-charge skip upon transfer of access authority in a multiprocessor system of FIG. 16, according to an embodiment of the present invention.

FIG. 5 is a flow chart of steps during operation of the multiprocessor system 500 of FIG. 16 for preventing a pre-charge skip upon transfer of access authority to the shared memory area 514 by the processors 502 and 504 that operate according to an open page policy.

Referring to FIG. 5, the access authority to the shared memory area 514 is granted to the first processor 502 via a first port A (60 in FIG. 7) or to the second processor 504 via a second port B (61 in FIG. 7) (steps S50 and S51 of FIG. 5). When the access authority is granted to the first processor 502, the first processor 502 accesses the shared memory area 514 according to the page open policy (step S52 of FIG. 5). When the access authority is granted to the second processor 504, the second processor 504 accesses the shared memory area 514 according to the page open policy (step S53 of FIG. 5).

In either case, the first and second processors 502 and 504 check for whether access authority will soon be transferred (step S54 of FIG. 5). If the access authority to the shared memory area 514 will not be soon transferred, the first processor 502 or the second processor 504 having the current access authority continues to access the shared memory area 514 according to the page open policy.

Figure 10:
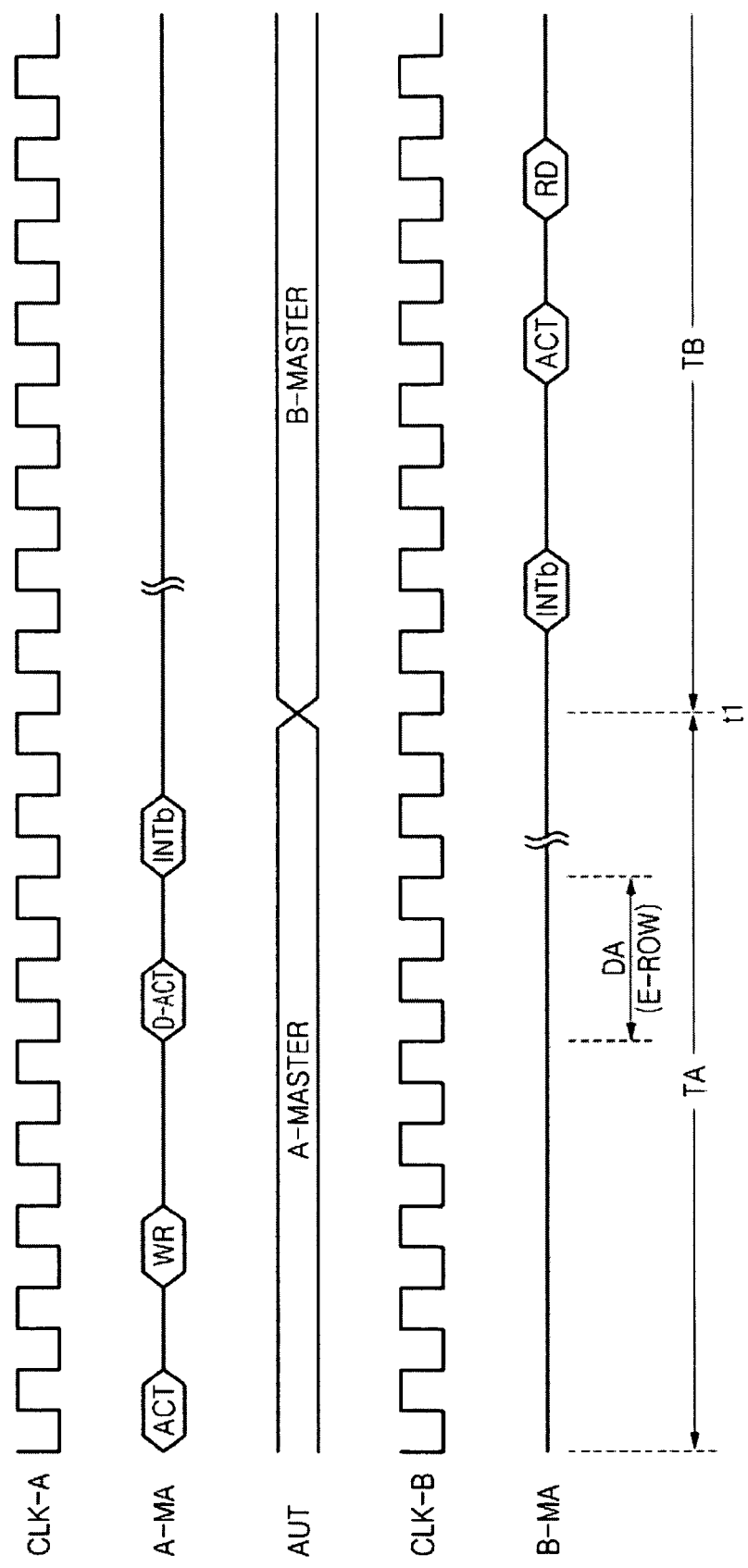
FIG. 10 shows a timing diagram of signals including a dummy row active command during operation of the multiprocessor system of FIG. 16 for preventing a pre-charge skip upon transfer of access authority, according to a first embodiment of the present invention.
Figure 15:
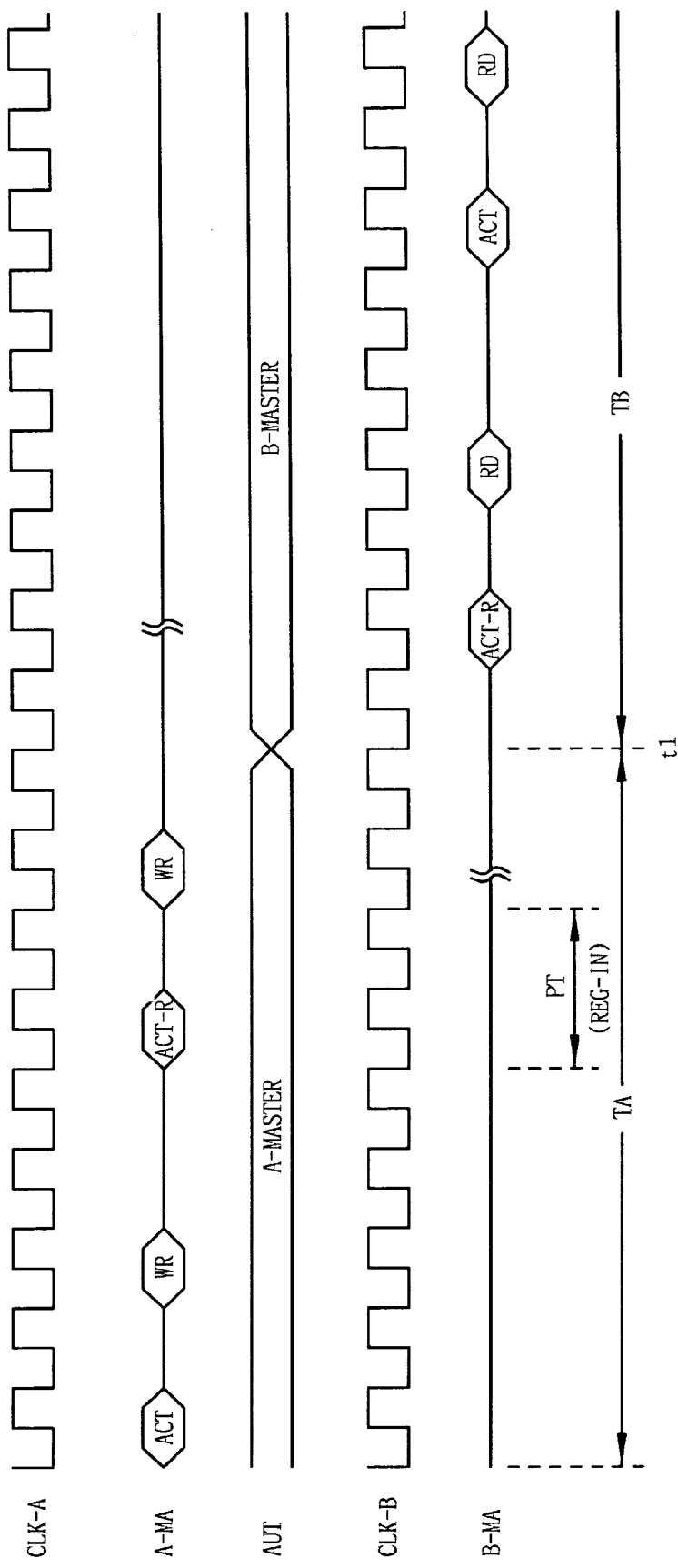
FIG. 15 shows a timing diagram of signals including a register row active command during operation of the multiprocessor system of FIG. 16 for preventing a pre-charge skip upon transfer of access authority, according to a second embodiment of the present invention.

On the other hand, if the access authority to the shared memory area 514 will soon be transferred, the current one of the first and second processors 502 and 504 having access authority to the shared memory device 514 generates a virtual row active command (i.e., a dummy row active command as illustrated in FIG. 10 or a register row active command as illustrated in FIG. 15) before such transfer (step S55 of FIG. 5). Thereafter, the access authority to the shared memory area 514 is transferred from one of the first and second processors 502 and 504 to the other of the first and second processors 502 and 504 (step S56 of FIG. 5). The subsequent one of the first and second processors 502 and 504 having access authority then accesses the shared memory area 514 according to the page open policy (step S57 of FIG. 5).

Referring to FIGS. 5 and 17, with generation of the virtual row active command at step S55 of FIG. 5, the pseudo operation execution unit 516 controls the pre-charge circuit 530 to pre-charge the bit-lines of the shared memory area 514 for preventing a pre-charge skip before the transfer of access authority. Accordingly, a page of the shared memory area 514 that is opened according to the page open policy is forcedly closed by pre-charging of the bit lines of the shared memory device 514 before the transfer of access authority.

The dummy row active command D-ACT of FIG. 10 is generated to activate a word line of the memory cell array 510 that is not a word line of the shared memory area 514. With such activation of the word line that is not a word line of the shared memory area 514, the bit-lines of the shared memory area 514 are pre-charged such that the last-opened page of the shared memory area 514 is closed before transfer of access authority. The word lines of the shared memory area 514 are not activated during execution of the dummy row active command D-ACT such that the bit-lines of the shared memory area 514 may be pre-charged from generation of the dummy row active command D-ACT.

The register row active command ACT-R is generated by one of the processors 502 or 504 for accessing the internal register 50 instead of any word line of the shared memory area 514. With such a register row active command ACT-R, the page open policy for any word line in the shared memory area 514 is completed such that the bit lines connected to such a word line are pre-charged for closing the last-opened page. Subsequently with transfer of access authority, pre-charge skip is prevented.

Figure 6:
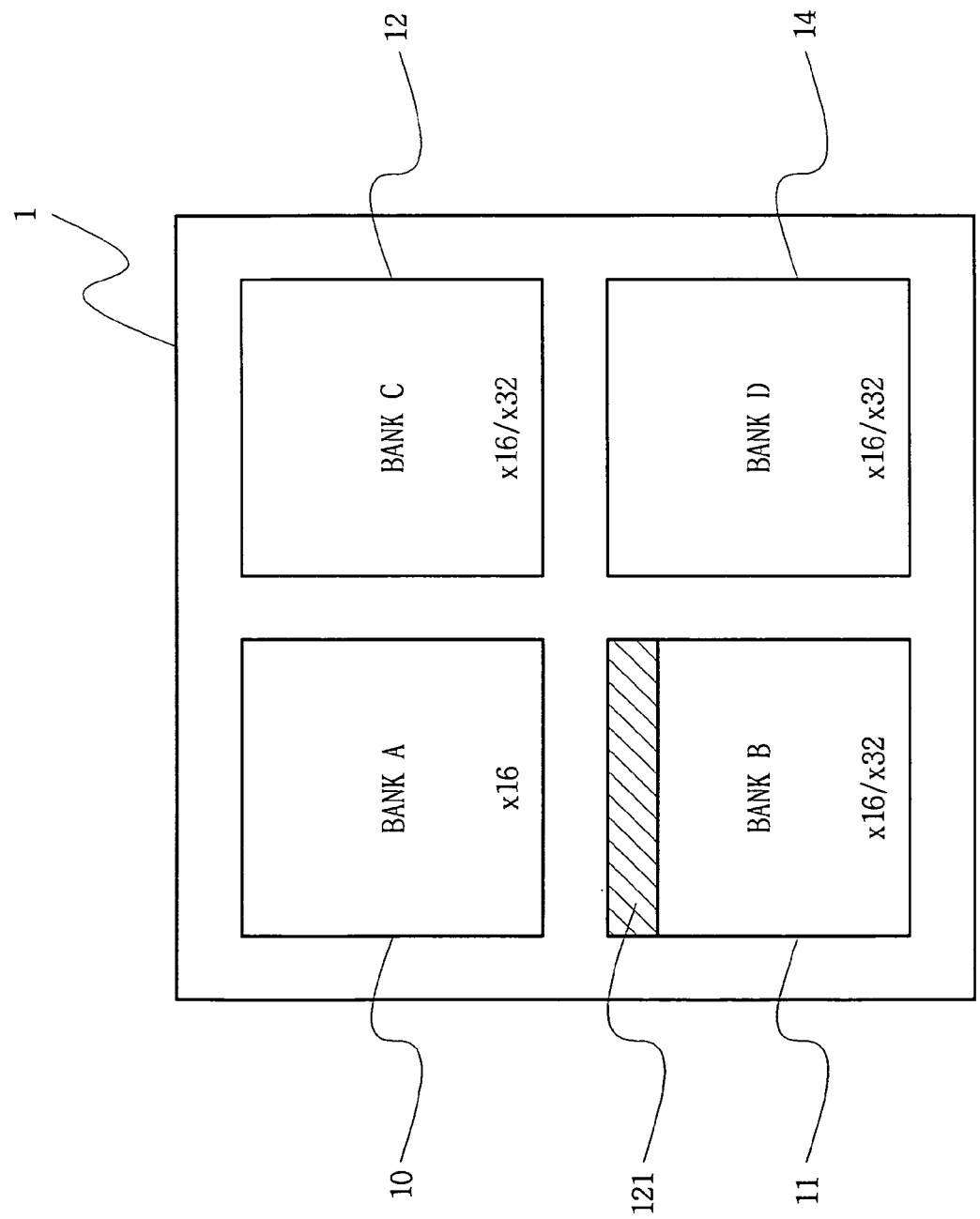
FIG. 6 is a block diagram of a memory cell array in a multi-path accessible DRAM device in the multiprocessor system of FIG. 16, according to an embodiment of the present invention.

FIG. 6 is a block diagram of the memory cell array 510 of FIG. 16 labeled as "1" in FIG. 6 according to an example embodiment of the present invention. Referring to FIG. 6, the memory cell array 1 includes first, second, third, and fourth memory areas 10, 11, 12, and 13, respectively. Each of the memory areas 10, 11, 12, and 13 may be a respective memory bank having memory capacity of 64 MB, 128 MB, 256 MB, 512 MB, or 1024 MB for example.

The first memory area 10 (bank A) is dedicated for access only by the first processor 502 via the first port 60. The third and fourth memory areas 12 and 13 (bank C and bank D) are dedicated for access only by the second processor 504 via the second port 61. The first, third, and fourth memory areas 10, 12, and 13 comprise the dedicated memory areas 512 of FIG. 16. The second memory area 11 (bank B) is the shared memory area 514 of FIG. 16 that is accessible by both of the first and second processors 502 and 504 via the first and second ports 60 and 61, respectively.

Figure 7:
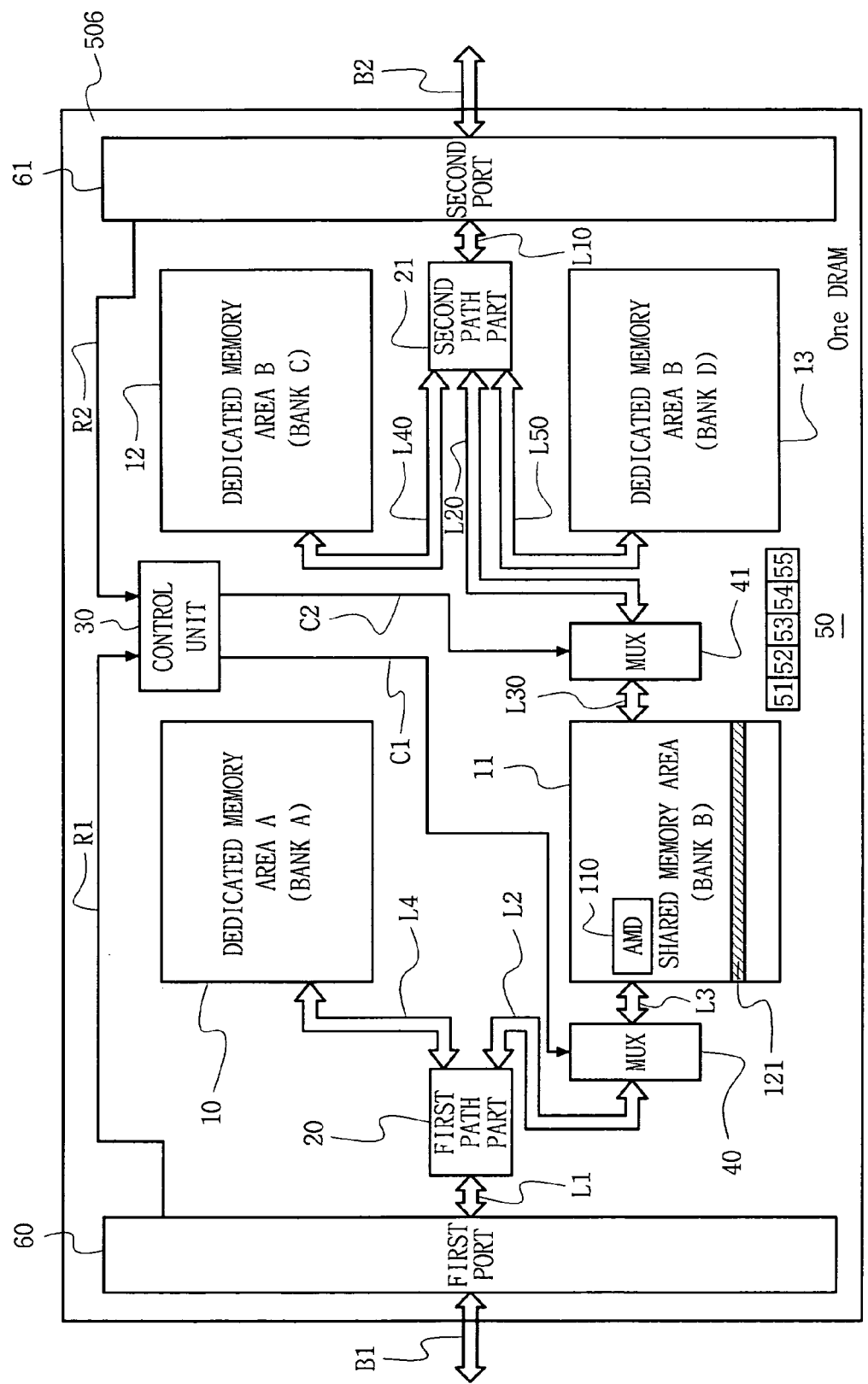
FIG. 7 is a block diagram of the multi-path accessible DRAM device of FIGS. 6 and 16, according to an embodiment of the present invention.

FIG. 7 is a block diagram of components in the one DRAM 506 of FIG. 16 used for access to the memory areas 10, 11, 12, and 13 by the first and second processors 502 and 504 via the first and second ports 60 and 61. Referring to FIG. 7, the internal register 50 is formed to be separate from and outside of the memory cell array 1. In addition, first and second path parts 20 and 21, respectively, first and second multiplexers 40 and 41, respectively, and a control unit 30 are disposed outside the memory cell array 1. The first and second ports 60 and 61 are connected to the first and second buses B1 and B2, respectively. The buses B1 and B2 may each be realized as a general-purpose input/output (GIPO) line.

Referring to FIGS. 6 and 7, the shared memory area 11 includes a storage table area 110 for storing address map data (AMD) of the flash memory device 503 of FIG. 16. The internal register 50 is used for interfacing between the processors 502 and 504 and is constructed of flip-flops, data latches, or SRAM cells. The internal register 50 is comprised of a semaphore area 51, a first mailbox area 52 (mail box for communication from the first processor 502 to the second processor 504), a second mailbox area 53 (mail box for communication from the second processor 504 to the first processor 502), a check bit area 54, and a reserve area 55.

The semaphore area 51 is a familiar term to processor system developers, and a control authority for the shared memory area 11 is written therein. Each of the first and second mailbox areas 52 and 53 stores a respective message such as a authority request, transmission data, and a command provided from one of the processors 502 or 504 to the other of the processors 502 and 504.

Such areas 51, 52, 53, 54, and 55 are accessed by a predetermined row address and each of such areas is accessed by a respective column address. Such a predetermined row address corresponds to a specific row area 121 of the shared memory area 11 in the address mapping for the shared memory area 11. For example, when a row address 0x7FFFFFFFh~0x8FFFFFFFh indicating the specific row area 121 of the shared memory area 11 is generated, the specific row area 121 of the shared memory area 11 is disabled while the internal register 50 is enabled instead, according to an aspect of the present invention.

Further referring to FIG. 7, the control unit 30 controls a respective connection to the shared memory area 11 by each of the first and second processors 502 and 504. A first signal line R1 between the first port 60 and the control unit 30 transfers a first external signal applied through bus B1 from the first processor 502. A second signal line R2 between the second port 61 and the control unit 30 transfers a second external signal applied through bus B2 from the second processor 504.

The first and second external signals may include a row address strobe signal RASB, a write enable signal WEB, and a bank selection address BA individually applied through the first and second ports 60 and 61, respectively. Signal lines C1 and C2 between the control unit 30 and the multiplexers 40 and 41, respectively, provide first and second transfer path decision signals MA and MB, respectively. The multiplexers 40 and 41 operate to connect a selected one of the first and second ports 60 and 61 to the shared memory area 11 according to the transfer path decision signals MA and MB.

The first processor 502 accesses the first memory area 10 via the first port 60, signal lines L1, the first path part 20, and signal lines L4. The first processor 502 accesses the second memory area 11 via the first port 60, signal lines L1, the first path part 20, signal lines L2, the first multiplexer 40, and signal lines L3.

The second processor 504 accesses the third memory area 12 via the second port 61, signal lines L10, the second path part 21, and signal lines L40. The second processor 504 accesses the fourth memory area 13 via the second port 61, signal lines L10, the second path part 21, and signal lines L50. The second processor 504 accesses the second memory area 11 via the second port 61, signal lines L10, the second path part 21, signal lines L20, the second multiplexer 41, and signal lines L30.

Figure 8:
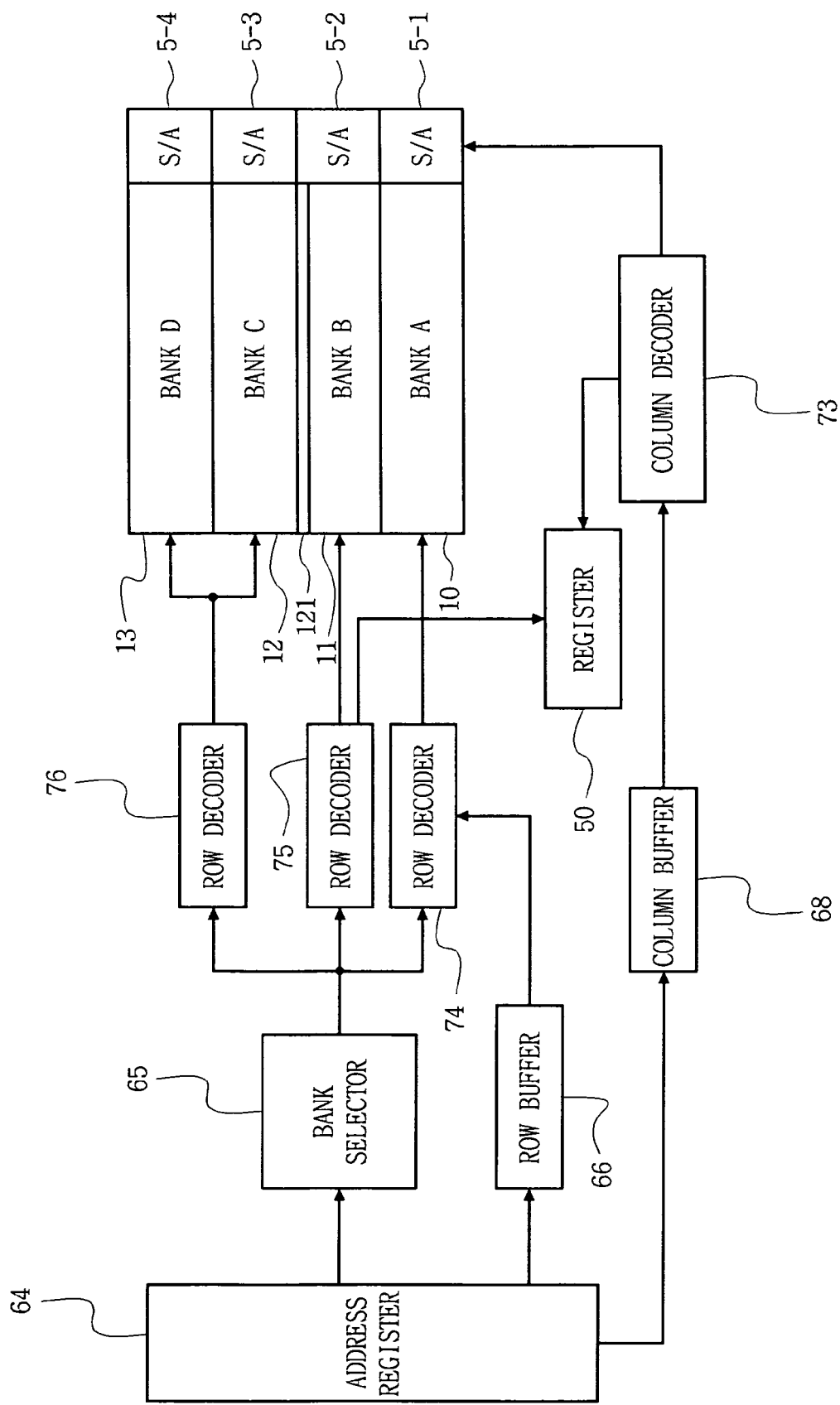
FIG. 8 is a block diagram including components of a pseudo operation execution unit in a decoding path of the multi-path accessible DRAM device of FIGS. 6, 7, and 16, according to an embodiment of the present invention.

FIG. 8 is a block diagram of components used for decoding an address for access to memory areas 10, 11, 12, and 13 of the memory cell array 1 of FIG. 6. Referring to FIG. 8, a pseudo operation execution unit according to an embodiment of the present invention is formed of an address register 64, a bank selector 65, a row buffer 66, a column buffer 68, row decoders 74, 75 and 76, the register 50, and a column decoder 73.

In FIG. 8, the memory banks 10, 11, 12 and 13 include sense amplifiers 5-1, 5-2, 5-3, and 5-4, respectively. The address register 64 stores row and column addresses sent from one of the processors 502 and 504. The bank selector 65 generates a selection signal to select one of the memory banks 10, 11, 12, and 13 according to a bank selection address from the address register 64. The internal register 50 is coupled to the row decoder 75 and the column decoder 73.

The pseudo operation execution unit including the components 50, 64, 65, 66, 68, 73, 74, 75, and 76 is for intentionally closing a last-opened page of the shared memory area 11 in response to a virtual row active command applied by one of the processors 502 and 504 before transfer of access authority. Such a pseudo operation execution unit is included in the control unit 30 of FIG. 7.

Figure 9:
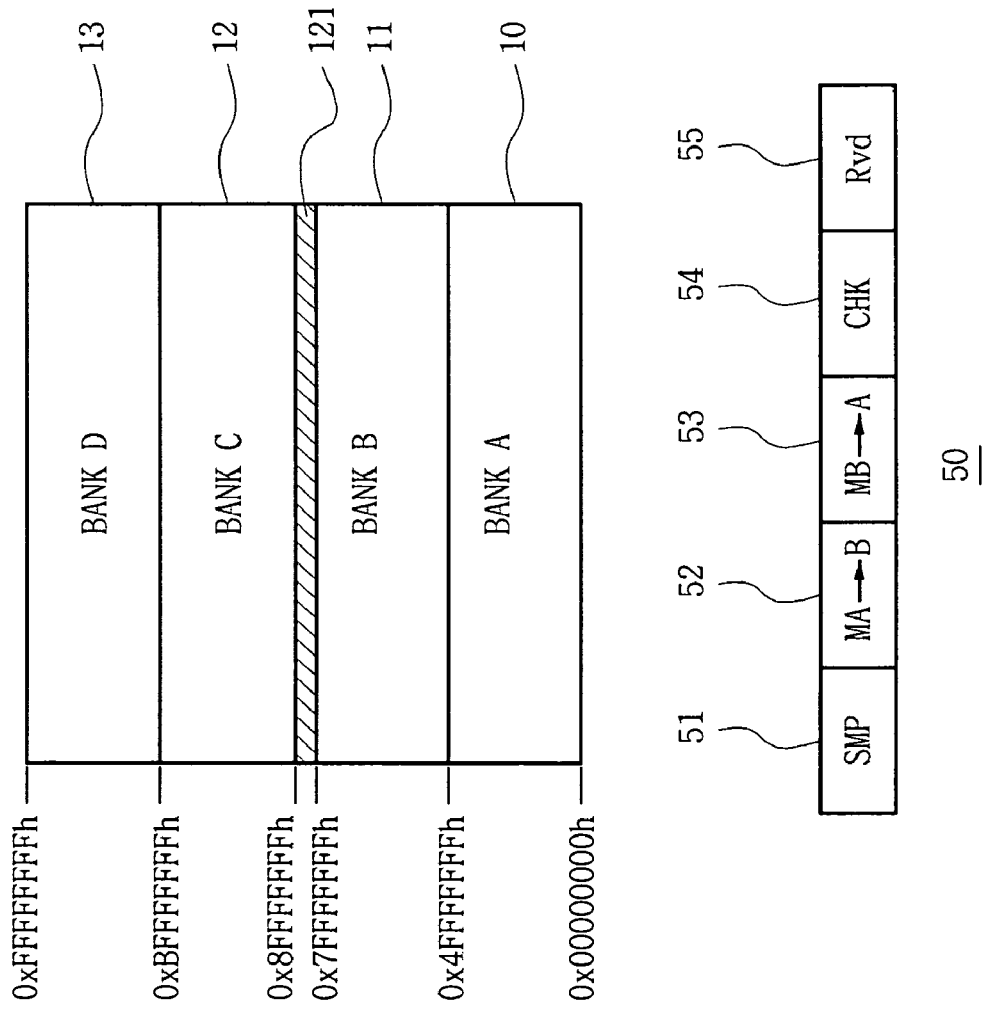
FIG. 9 illustrates address allocation for memory areas of the memory cell array of FIG. 6 and an internal register in the multi-path accessible DRAM device of FIGS. 6, 7, and 16, according to an embodiment of the present invention.

FIG. 9 illustrates an example address allocation for the memory areas 10, 11, 12, and 13 and the internal register 50. For example, when each of the memory banks 10, 11, 12, and 13 has a capacity of 16 megabits or 32 megabits, the specific row address ((0x7FFFFFFFh~0x8FFFFFFFh, corresponding to 1 row size) corresponding to the specific row portion of the shared memory area 11 is actually allocated as the row address for the internal register 50. When such a specific row address (0x7FFFFFFFh~0x8FFFFFFFh) is generated, the corresponding word line for the specific row 121 of the shared memory area 11 is disabled, and the internal register 50 is enabled instead.

As a result, the semaphore area 51 and the mailbox areas 52 and 53 are accessed by using direct address mapping. The row decoder 75 is implemented to decode the specific row address (0x7FFFFFFFh~0x8FFFFFFFh) as indicating enablement of the internal register 50, when the register row active command ACT-R is generated as illustrated in FIG. 15 in the second embodiment of the present invention. In FIG. 9, the semaphore area 51, the first mailbox area 52, and the second mailbox area 53 each have allocation of 16 bits, and the check bit area 54 has an allocation of 4 bits, in an example embodiment of the present invention.

Figure 11:
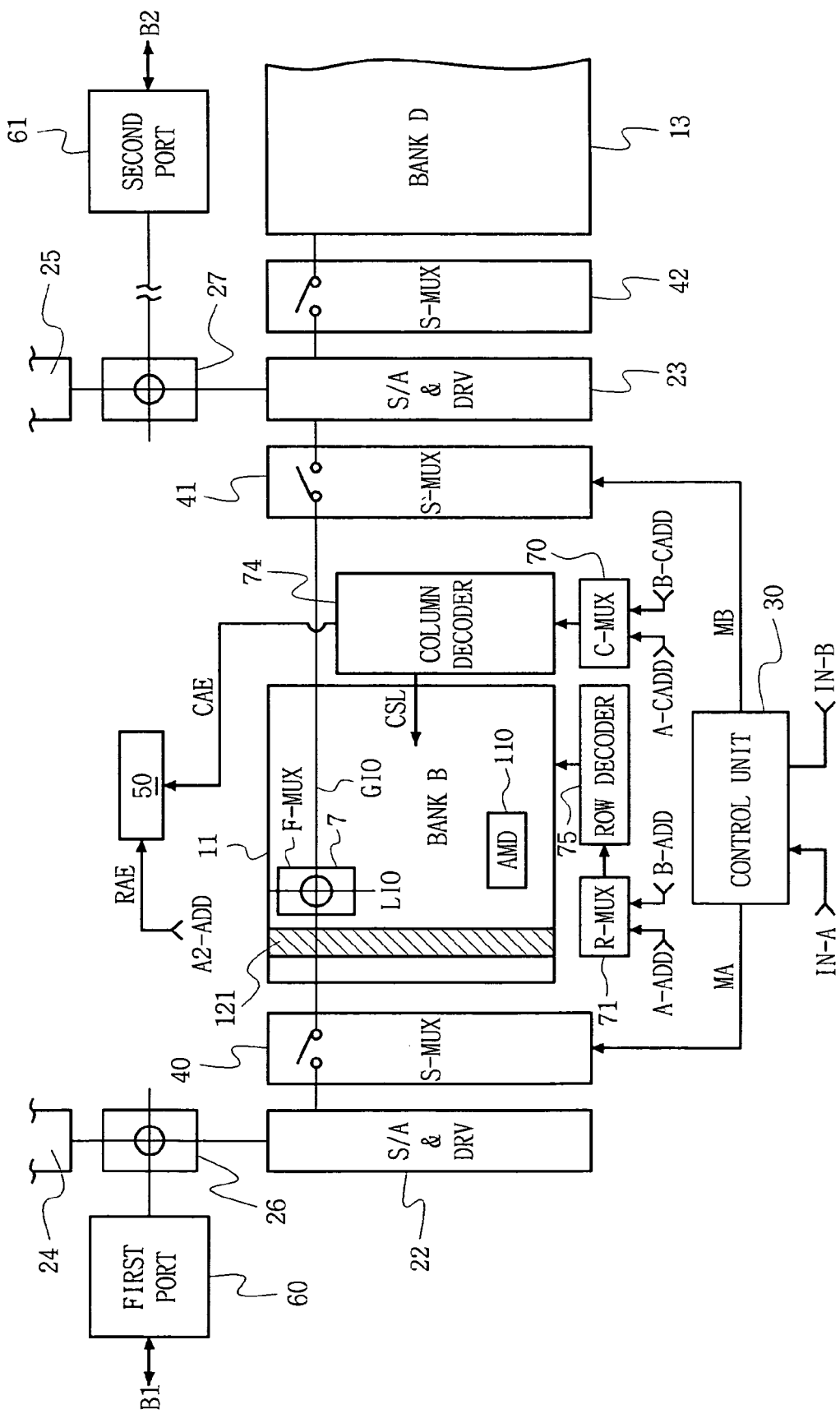
FIG. 11 is a block diagram of components determining access to a shared memory area within the multi-path accessible DRAM device of FIGS. 6, 7, and 16, according to an embodiment of the present invention.
Figure 12:
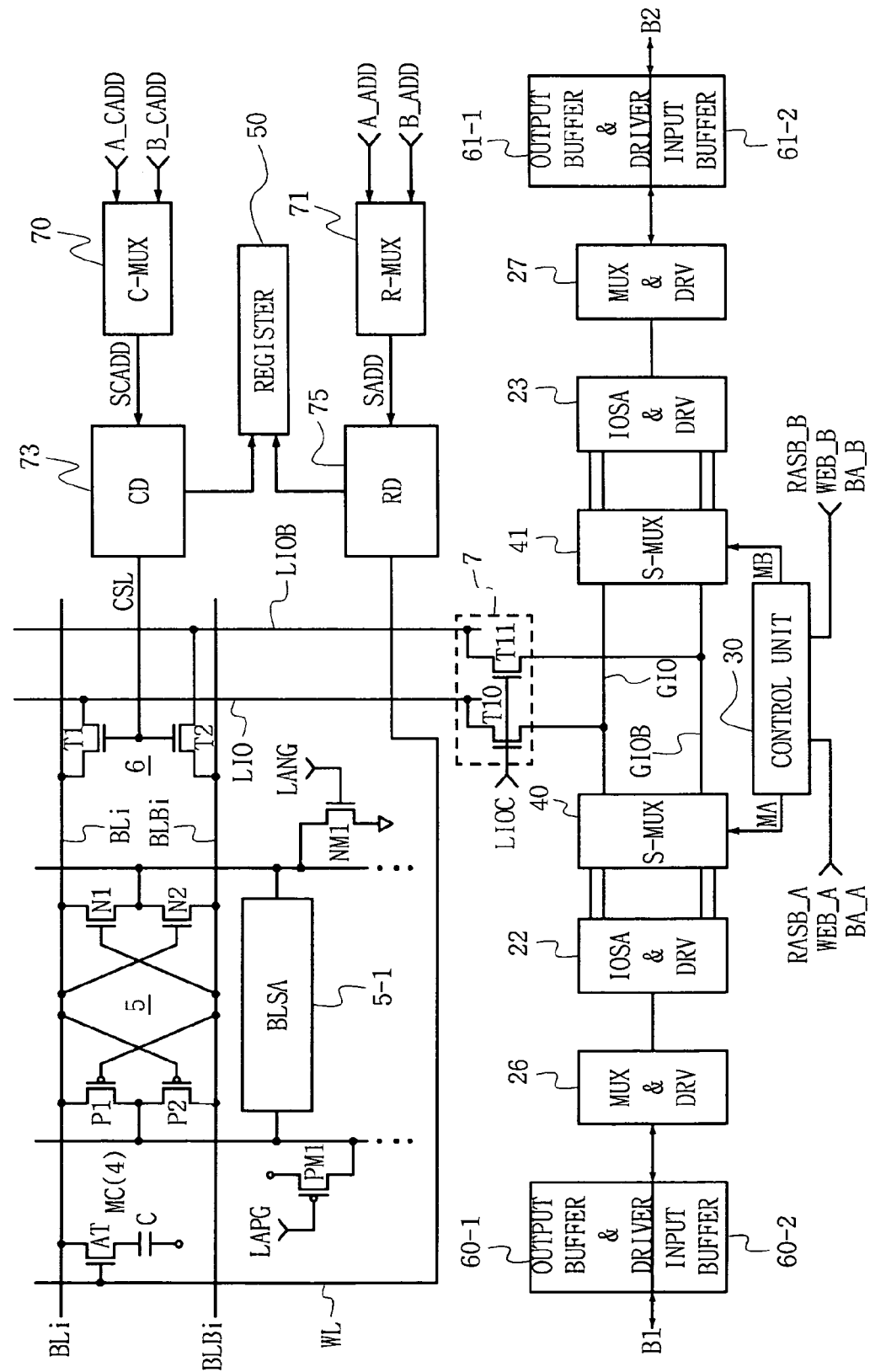
FIG. 12 is a circuit diagram of the multi-path accessible DRAM device of FIGS. 6, 7, and 16, according to an embodiment of the present invention.

FIG. 11 is a block diagram with further components in the shared one DRAM 506 of FIG. 16, according to an embodiment of the present invention. FIG. 12 shows a circuit diagram of further components in the shared one DRAM 506 of FIG. 16, according to an embodiment of the present invention.

Referring to FIGS. 11 and 12, the first and second multiplexers 40 and 41 and first and second sense amplifiers and drivers 22 and 23 are disposed symmetrically with respect to the shared memory area 11. The shared memory area 11 is comprised of an array of DRAM (dynamic random access memory) cells. An example DRAM cell 4 is shown in FIG. 12 as including an access transistor AT and a storage capacitor C. Each DRAM cell 4 is coupled at an intersection of a respective word line WL and a respective bit line BLi.

The word line WL is connected to a gate of the access transistor AT and to the row decoder 75. The row decoder 75 applies row decoded signals to the word lines WL and the register 50 in response to a selected row address SADD of a row address multiplexer 71. The bit line BLi of a bit line pair is connected to a drain of the access transistor AT and a column selection transistor T1. A complementary bit line BLBi of the bit line pair is connected to a column selection transistor T2.

PMOS transistors P1 and P2 and NMOS transistors N1 and N2 coupled to the bit line pair BLi and BLBi form a bit line sense amplifier 5. Sense amplifier driving transistors PM1 and NM1 receive drive signals LAPG and LANG, respectively, for driving the bit line sense amplifier 5. The pre-charge circuit 530 of FIG. 17 is comprised of a respective pre-charge unit connected to each bit line pair BLi and BLBi for pre-charging the bit line pair BLi and BLBi in response to control signals from the row decoder 75.

A column selection gate 6 includes column selection transistors T1 and T2 connected to a column selection line CSL. The column decoder 73 applies a column decoding signal to the column selection line CSL and the register 50 in response to a selected column address SCADD of a column address multiplexer 70.

A local input/output line LIO in FIG. 11 is actually realized as a local input/output line pair LIO and LIOB in FIG. 12. When transistors T10 and T11 of a bit-line multiplexer 7 (F-MUX) are turned on by a local input/output line control signal LIOC, the local input/output line pair LIO and LIOB is connected to a global input/output line pair GIO and GIOB, respectively.

In that case for a read operation, data on the local input/output line pair LIO and LIOB are transferred to the global input/output line pair GIO and GIOB, respectively. Alternatively for a write operation, data on the global input/output line pair GIO and GIOB are transferred to the local input/output line pair LIO and LIOB, respectively. The local input/output line control signal LIOC may be a signal generated in response to a decoding signal generated from the row decoder 75.

When the first path decision signal MA from the control unit 30 is activated, read data transferred to the global input/output line pair GIO and GIOB is further transferred to the input/output sense amplifier and driver 22 through the first multiplexer 40. Input/output sense amplifier and driver 22 amplifies data having a level weakened through its data path. Such amplified read data from the input/output sense amplifier and driver 22 is transferred to the first port 60 through a first multiplexer and driver 26.

While the first path decision signal MA is activated, the second path decision signal MB is inactivated. Thus, the second multiplexer 41 is disabled such that the second processor 504 does not have access to the shared memory area 11. Nevertheless in this case, the second processor 504 may still access the dedicated memory areas 12 and 13 through the second port 61.

When the first path decision signal MA is activated, write data is applied from the first port 60 to the global input/output line pair GIO and GIOB through the first multiplexer and driver 26, the first input/output sense amplifier and driver 22, and the first multiplexer 40. When the bit-line multiplexer 7 (F-MUX) is activated, the write data is transferred from the global input/output line pair GIO and GIOB to the local input/output line pair LIO and LIOB to be stored in the selected DRAM cell 4.

Referring to FIG. 12, the first port 60 includes a first output buffer and driver 60-1 and a first input buffer 60-2. The second port 61 includes a second output buffer and driver 61-1 and a second input buffer 61-2.

The two input/output sense amplifier and drivers 22 and 23 are formed for the shared memory area 11. In addition, the two multiplexers 40 and 41 having mutually complementary operation are formed such that just one of the processors 502 and 504 accesses the shared memory area 11 at a time.

The first and second processors 502 and 504 share common components and signal lines disposed between the global input/output line pairs GIO and GIOB and the shared memory area 11. In contrast, the first and second processors 502 and 504 independently use separate components and lines disposed between the first and second ports 60 and 61, respectively, and the first and second multiplexers 40 and 41, respectively.

In more detail, the first and second processors 502 and 504 share the global input/output line pairs GIO and GIOB, the local input/output line pairs LIO and LIOB, the bit line pairs BL and BLB, the bit line sense amplifiers 5, the pre-charge circuit 530 and the DRAM cells 4 of the shared memory area 11. FIG. 11 also shows an input/output sense amplifier and driver 24 for the dedicated memory area 10 of the first processor 502, and an input/output sense amplifier and driver 25 for the dedicated memory areas 12 and 13 of the second processor 504.

Figure 13:
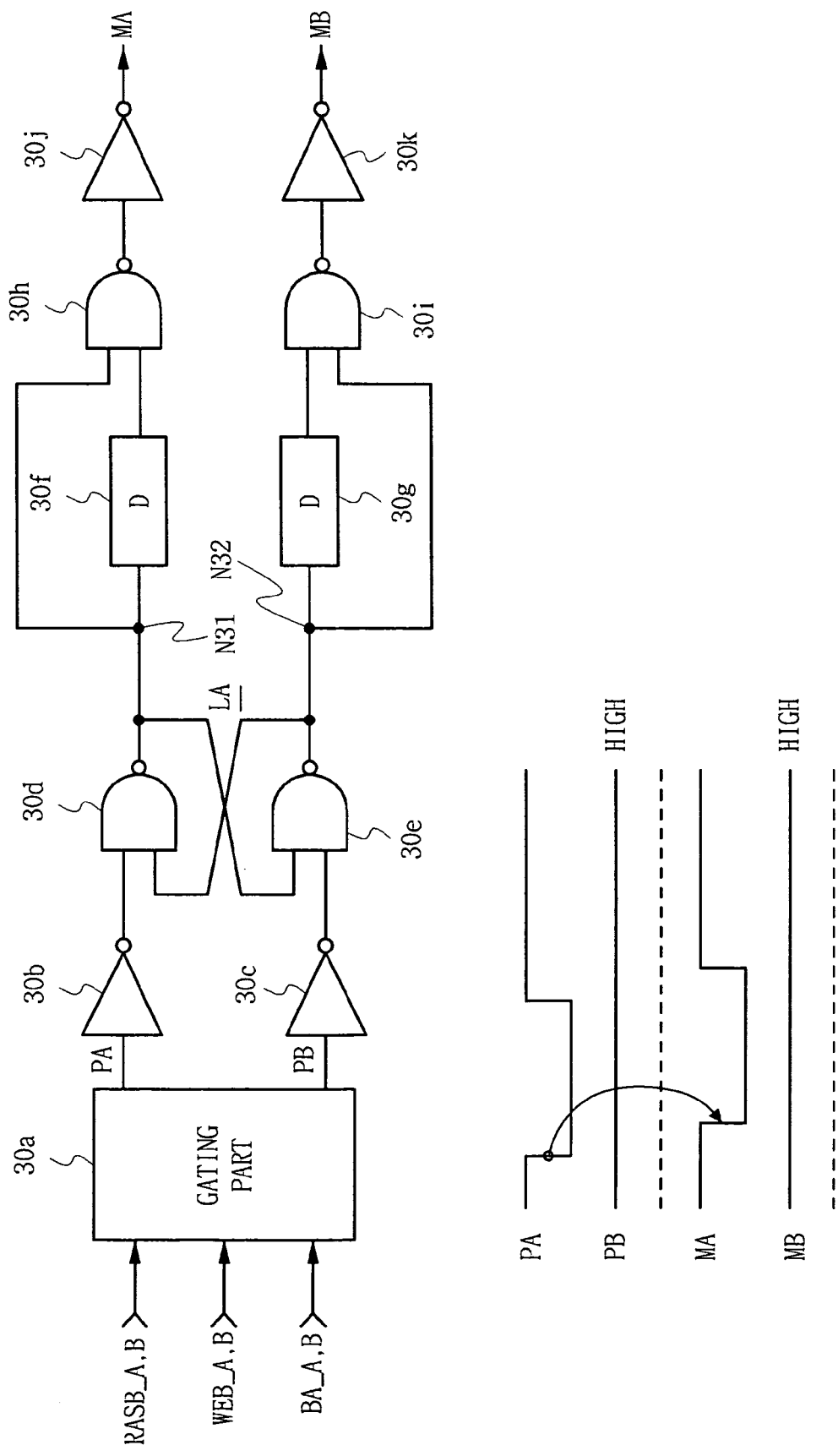
FIG. 13 is a circuit diagram of a control unit in the multi-path accessible DRAM device of FIGS. 7, 11 and 12, according to an embodiment of the present invention.

FIG. 13 shows a circuit diagram of components of the control unit 30 for generating the path decision signals MA and MB, according to an example embodiment of the present invention. Referring to FIG. 13, a gating part 30a formed of a plurality of logic gates, receives a respective row address strobe signal RASB_A,B, a respective write enable signal WEB_A,B, and a respective bank selection address BA_A,B sent through each of the first and second ports 60 and 61 from the first and second processors 502 and 504. The gating part 30a generates gating signals PA and PB from such signals and may have a timing diagram as illustrated in FIG. 13 for example.

In the example of FIG. 13, when the gating signal PA is at a logic low level, the first path decision signal MA is generated to be at the logic low level. In addition when the gating signal PA is at the logic low level, the gating signal PB is at a logic high level, and the second path decision signal MB is generated to be at the logic high level.

When the row address strobe signal RASB is first input to the gating part 30a through one of the ports 60 and 61, the shared memory area 11 is accessible to that one port. If the row address strobe signals RASB are generated simultaneously to the gating part 30a through the two ports 60 and 61, the gating part 30a decides one of the processors 502 and 504 as having priority to access the shared memory area 11.

The control unit 30 in FIG. 13 further includes inverters 30b, 30c, 30j and 30k, NAND gates 30d, 30e, 30h, and 30i, and delay devices 30f and 30g that are connected in the configuration of FIG. 13. In this configuration, the first path decision signal MA is generated by delaying and latching the first gating signal PA by a first predetermined delay time. Similarly, the second path decision signal MB is generated by delaying and latching the second gating signal PB by a second predetermined delay time.

Figure 14:
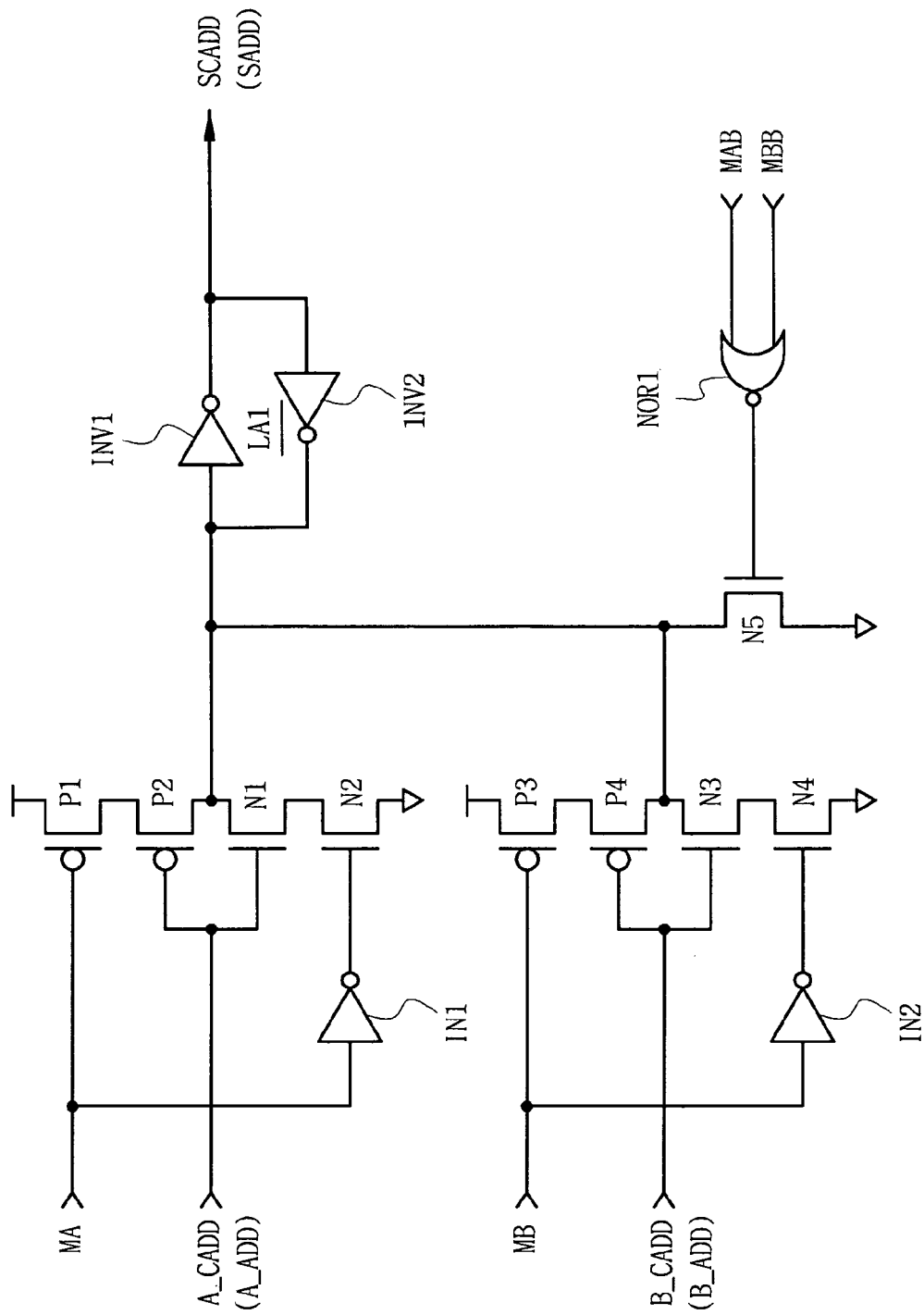
FIG. 14 is a circuit diagram of an example address multiplexer of FIGS. 11 and 12, according to an embodiment of the present invention.

FIG. 14 shows a circuit diagram of an example one 70 of the column address multiplexer 70 and the row address multiplexer 71 in FIGS. 11 and 12. However, the row address multiplexer 71 would be implemented similarly to the column address multiplexer 70 of FIG. 14.

The column address multiplexer 70 of FIG. 14 includes a first clocked CMOS inverter including PMOS transistors P1 and P2 and NMOS transistors N1 and N2 and a second clocked CMOS inverter including PMOS transistors P3 and P4 and NMOS transistors N3 and N4. A first column address A_CADD from the first processor 502 is applied to the gates of transistors P2 and N1, and a second column address B_CADD from the second processor 504 is applied to the gates of transistors P4 and N3.

The first path decision signal MA is applied to the gate of the transistor P1, and the inverse of the first path decision signal MA is applied to the gate of the transistor N2. The second path decision signal MB is applied to the gate of the transistor P3, and the inverse of second first path decision signal MB is applied to the gate of the transistor N4.

The column address multiplexer 70 of FIG. 14 also includes inverters INV1 and INV2 forming an inverter latch LA1. The drains of the transistors P2, N1, P4, and N3 are connected to the input of the inverter latch LA1 and to the drain of transistor N5. The inverses MAB and MBB of the first and second path decision signals MA and MB are input to a NOR gate NOR1 having an output applied on a gate of the transistor N5 with a source connected to the ground node. The output of the inverter latch LA1 generates the selected column address SCADD selected from one of the column addresses A_CADD and B_CADD depending on the first and second path decision signals MA and MB.

For example, when the first path decision signal MA is at the logic low level, the first column address A_CADD is selected as the output SCADD. In that case, the second path decision signal MB is at the logic high level and the second column address B_CADD is not transmitted through the inverter latch LA1. Subsequently, when the output of the NOR gate NOR1 becomes the logic high level, the NMOS transistor N5 is turned on such that the logic level latched by the latch LA1 is reset to the logic low level. Similarly, when the first path decision signal MA is at the logic high level and the second path decision signal MB is at the logic low level, the second column address B_CADD is selected as the output SCADD.

FIG. 10 shows a timing diagram when a dummy row active command D-ACT is generated (step S55 in FIG. 5) in the multiprocessor system 500 of FIG. 16 to prevent a pre-charge skip upon transfer of access authority to the shared memory area 11, according to a first embodiment of the present invention. FIG. 15 shows a timing diagram when a register row active command ACT-R is generated (step S55 in FIG. 5) in the multiprocessor system 500 of FIG. 16 to prevent a pre-charge skip upon transfer of access authority to the shared memory area 11, according to a second embodiment of the present invention.

Referring to FIG. 10, a first system clock signal CLK-A is applied to the first port 60, and a second system clock signal CLK-B is applied to the second port 61. Signal A-MA indicates the commands generated by the first processor 502 applied to the first port 60, and signal B-MA indicates the commands generated by the second processor 504 applied to the second port 61.

A signal AUT indicates which one of the processors 502 and 504 has access authority to the shared memory area 11. For example in FIG. 10, the first processor 502 has access authority during a first time period TA, and the second processor 504 has access authority during a second time period TB, with transfer of access authority occurring at a time point t1.

Further referring to FIG. 10, while the first processor 502 has access authority to the shared memory device 11 during time period TA, the first processor 502 initially generates a row active command ACT and a write command WR that are executed by the one DRAM 506 according to a page open policy. Thereafter, the first processor 502 is notified that a transfer of access authority to the shared memory area 11 is to occur within a predetermined time period at time point t1.

Accordingly, the first processor 502 generates a dummy row active command D-ACT as an example virtual row active command and applies an interrupt INTb before the time point t1. The dummy row active command D-ACT is generated with a row address corresponding to a word-line that is not any word-line of the shared memory area 11 such that no word line of the shared memory area 11 is activated from such a dummy row active command D-ACT.

Subsequently, upon receiving such a dummy row active command D-ACT, the pseudo operation execution unit 516 decodes such a row address of the dummy row active command D-ACT to control the pre-charge circuit 530 to pre-charge the bit-lines coupled to the last opened word-line of the shared memory area 11. Such pre-charging and thus closing of the last-opened page of the shared memory area 11 occurs during a time interval DA before the transfer of access authority at time point t1. After time point t1, a level of the interrupt signal INTb is cleared to an original state, and the second processor 504 accesses the shared memory area 11 with the row active and read commands ACT and RD according to the page open policy.

Referring to FIG. 15, a first system clock signal CLK-A is applied to the first port 60, and a second system clock signal CLK-B is applied to the second port 61. In FIG. 15, signal A-MA indicates the commands generated by the first processor 502 applied to the first port 60, and signal B-MA indicates the commands generated by the second processor 504 applied to the second port 61.

Further in FIG. 15, a signal AUT indicates which one of the processors 502 and 504 has access authority to the shared memory area 11. For example in FIG. 15, the first processor 502 has access authority during a first time period TA, and the second processor 504 has access authority during a second time period TB, with transfer of access authority occurring at a time point t1.

Further referring to FIG. 15, while the first processor 502 has access authority to the shared memory device 11 during time period TA, the first processor 502 initially generates a row active command ACT and a write command WR that are executed by the one DRAM 506 according to a page open policy. Thereafter, the first processor 502 is notified that a transfer of access authority to the shared memory area 11 is to occur within a predetermined time period at time point t1.

Accordingly, the first processor 502 generates a register row active command ACT-R as an example virtual row active command and a write command WR for writing into the internal register 50 before the time point t1. The register row active command ACT-R is generated with a row address corresponding to the specific row portion 121 of the shared memory area 11.

Subsequently, upon receiving such a register row active command ACT-R, the pseudo operation execution unit 516 decodes the row address of the register row active command ACT-R to control the pre-charge circuit 530 to pre-charge the bit-lines coupled to the last-opened word-line of the shared memory area 11. Such pre-charging and thus closing of the last-opened page of the shared memory area 11 occurs during a time interval PT before the transfer of access authority at time point t1.

In addition during the time interval PT, the first processor 502 accesses the internal register 50, while the specific row portion 121 of the shared memory area is not activated. Thus, during execution of the register row active command ACT-R, no word line of the shared memory area 11 is activated as just the internal register 50 is activated for access.

After time point t1 in FIG. 15, the second processor 504 has access authority to the shared memory area 11. After time point t1, the second processor 504 generates another register row active command ACT-R and a read command RD for accessing the internal register 50. Subsequently, the second processor 504 generates row active and read commands ACT and RD for accessing the shared memory area 11 according to the page open policy.

In this manner, with generation of the dummy row active command D-ACT or the register row active command ACT-R before transfer of access authority, the bit-lines connected to a last-opened page of the shared memory area 11 are pre-charged. Thus, the last-opened page is closed before the transfer of access authority to the shared memory area 11 to prevent pre-charge skipping.

While the present invention has been shown and described with reference to exemplary embodiments thereof, it will be understood by those of ordinary skill in the art that various changes in form and detail may be made herein without departing from the spirit and scope of the present invention, as defined by the following claims.

For example, the present invention may also be applied to a multiprocessor system with more than two processors when the one shared DRAM 506 has more than two corresponding ports for shared access to the shared memory area 11. Thus, the present invention is not limited to the number of processors in the multiprocessor system. Further, the present invention is not limited to any special combination of processors when the same or mutually different processors are adapted therein. In the multiprocessor system 500, each of the processors 502 and 504 may be a microprocessor, a CPU, a digital signal processor, a micro-controller, a reduced command set computer, a complex command set computer, or the like.

In addition, the present invention is not limited to any particular designations of the memory areas of the one DRAM 506. For example, of the four memory areas 10, 11, 12, and 13, one is a shared memory area and the other three are dedicated memory areas. Alternatively, the present invention may also be practiced with all four memory areas being shared memory areas. Furthermore, the present invention may also be practiced when the one shared DRAM device 506 is instead a shared static random access memory device, a shared nonvolatile memory device, or other type of shared memory device.

The present invention is limited only as defined in the following claims and equivalents thereof.

What is claimed is:

1. A multi-path accessible semiconductor memory device, comprising:
   a shared memory area accessible by first and second processors according to a page open policy; and
   a pseudo operation execution unit that responds to a virtual active command from one of the first and second processors to close a last-opened page,
   wherein the virtual active command is generated with a row address not corresponding to any row of the shared memory area.

2. The multi-path accessible semiconductor memory device of claim 1, wherein bit-lines of a last accessed row are pre-charged for closing the last-opened page.

3. The multi-path accessible semiconductor memory device of claim 1, wherein the virtual active command is a dummy row active command indicating a dummy row to be activated with the dummy row not being part of the shared memory area.

4. The multi-path accessible semiconductor memory device of claim 3, wherein the dummy row is part of a memory cell array including the shared memory area.

5. The multi-path accessible semiconductor memory device of claim 1, further comprising:
   a register formed outside of the shared memory area, wherein the register is a semaphore register used for interfacing between the first and second processors.

6. The multi-path accessible semiconductor memory device of claim 5, wherein the virtual active command is for activating the register for access by one of the first and second processors.

7. The multi-path accessible semiconductor memory device of claim 5, wherein the register is formed outside of a memory cell array including the shared memory area.

8. The multi-path accessible semiconductor memory device of claim 5, wherein the shared memory area is comprised of DRAM (dynamic random access memory) cells, and wherein the register is comprised of flip-flops.

9. The multi-path accessible semiconductor memory device of claim 1, wherein the one of the first and second processors generates the virtual active command to close the last-opened page before access authority is transferred to the other of the first and second processors.

10. The multi-path accessible semiconductor memory device of claim 1, further comprising:
    a first dedicated memory area accessible only by the first processor; and
    a second dedicated memory area accessible only by the second processor.

11. The multiprocessor system of claim 1, wherein the multi-path accessible semiconductor memory device further includes:
    a first dedicated memory area accessible only by the first processor; and
    a second dedicated memory area accessible only by the second processor.

12. A multiprocessor system, comprising:
    a first processor;
    a second processor; and
    a multi-path accessible semiconductor memory device including:
        a shared memory area accessible by the first and second processors according to a page open policy; and
        a pseudo operation execution unit that responds to a virtual active command from one of the first and second processors to close a last-opened page,
        wherein the virtual active command is generated with a row address not corresponding to any row of the shared memory area.

13. The multiprocessor system of claim 12, wherein bit-lines of a last accessed row are pre-charged for closing the last-opened page.

14. The multiprocessor system of claim 12, wherein the virtual active command is a dummy row active command indicating a dummy row to be activated with the dummy row not being part of the shared memory area.

15. The multiprocessor system of claim 14, wherein the dummy row is part of a memory cell array including the shared memory area.

16. The multiprocessor system of claim 12, wherein the multi-path accessible semiconductor memory device further includes:
    a register formed outside of the shared memory area, wherein the register is a semaphore register used for interfacing between the first and second processors.

17. The multiprocessor system of claim 16, wherein the virtual active command is for activating the register for access by one of the first and second processors.

18. The multiprocessor system of claim 16, wherein the register is formed outside of a memory cell array including the shared memory area.

19. The multiprocessor system of claim 16, wherein the shared memory area is comprised of DRAM (dynamic random access memory) cells, and wherein the register is comprised of flip-flops.

20. The multiprocessor system of claim 12, wherein the one of the first and second processors generates the virtual active command to close the last-opened page before access authority is transferred to the other of the first and second processors.

* * * * *